US007252097B2

(12) United States Patent
Boyd et al.

(10) Patent No.: US 7,252,097 B2
(45) Date of Patent: Aug. 7, 2007

(54) SYSTEM AND METHOD FOR INTEGRATING IN-SITU METROLOGY WITHIN A WAFER PROCESS

(75) Inventors: John M. Boyd, Atascadero, CA (US); John M. de Larios, Palo Alto, CA (US); Michael Ravkin, Sunnyvale, CA (US); Fred C. Redeker, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 563 days.

(21) Appl. No.: 10/606,022

(22) Filed: Jun. 24, 2003

(65) Prior Publication Data

US 2004/0182422 A1    Sep. 23, 2004

Related U.S. Application Data

(63) Continuation-in-part of application No. 10/404,270, filed on Mar. 31, 2003, now Pat. No. 7,069,937, which is a continuation-in-part of application No. 10/330,843, filed on Dec. 24, 2002, which is a continuation-in-part of application No. 10/261,839, filed on Sep. 30, 2002, application No. 10/606,022, which is a continuation-in-part of application No. 10/330,897, filed on Dec. 24, 2002, and a continuation-in-part of application No. 10/404,692, filed on Mar. 31, 2003, now Pat. No. 6,988,327.

(51) Int. Cl.
*B08B 3/00* (2006.01)
*B08B 7/04* (2006.01)

(52) U.S. Cl. .................. 134/57 R; 134/95.2; 134/99.1; 134/902

(58) Field of Classification Search .............. 134/56 R, 134/57 R, 58 R, 94.1, 95.2, 99.1, 113, 166 R, 134/167 R, 172, 902
See application file for complete search history.

(56) References Cited

U.S. PATENT DOCUMENTS

| | | | |
|---|---|---|---|
| 4,838,289 A | 6/1989 | Kottman et al. | 134/153 |
| 5,271,774 A | 12/1993 | Leenaars et al. | 134/31 |
| 5,705,223 A | 1/1998 | Bunkofske | 427/240 |
| 5,945,351 A | 8/1999 | Mathuni | 438/706 |
| 5,997,653 A | 12/1999 | Yamasaka | 134/2 |
| 6,230,722 B1 | 5/2001 | Mitsumori et al. | |
| 6,398,975 B1 | 6/2002 | Mertens et al. | 216/92 |
| 6,446,358 B1 | 9/2002 | Mitsumori et al. | |

(Continued)

FOREIGN PATENT DOCUMENTS

EP    1 489 461    12/2004

(Continued)

OTHER PUBLICATIONS

International Search Report, mailed Feb. 8, 2005.

(Continued)

*Primary Examiner*—Joseph L. Perrin
(74) *Attorney, Agent, or Firm*—Martine Penilla & Gencarella, LLP

(57) ABSTRACT

A system and method for processing a wafer includes applying a process to the wafer. The process being supported by a surface tension gradient device. A result of the process is monitored. The monitored result is output.

15 Claims, 22 Drawing Sheets

U.S. PATENT DOCUMENTS

| | | | |
|---|---|---|---|
| 6,491,764 B2 | 12/2002 | Mertens et al. | ............... 134/36 |
| 6,555,017 B1 | 4/2003 | Rushford et al. | |
| 6,629,540 B2 | 10/2003 | Mitsumori et al. | |
| 2004/0136494 A1 | 7/2004 | Lof et al. | |

FOREIGN PATENT DOCUMENTS

| | | |
|---|---|---|
| EP | 1 489 462 | 12/2004 |
| JP | 02280330 | 11/1990 |
| JP | 02309638 | 12/1990 |
| JP | 11350169 | 12/1999 |
| WO | WO 99/49504 | 9/1999 |
| WO | WO 02/32825 | 4/2002 |

OTHER PUBLICATIONS

Owa, et al., "Immersion Lithography; Its Potential Performance and Issues," *Proceedings of the SPIE, SPIE*, Bellingham, VA, vol. 5040, No. 1, Feb. 28, 2003, pp. 724-733, XP002294500, ISSN: 0277-786X.

International Search Report, mailed Nov. 16, 2004.

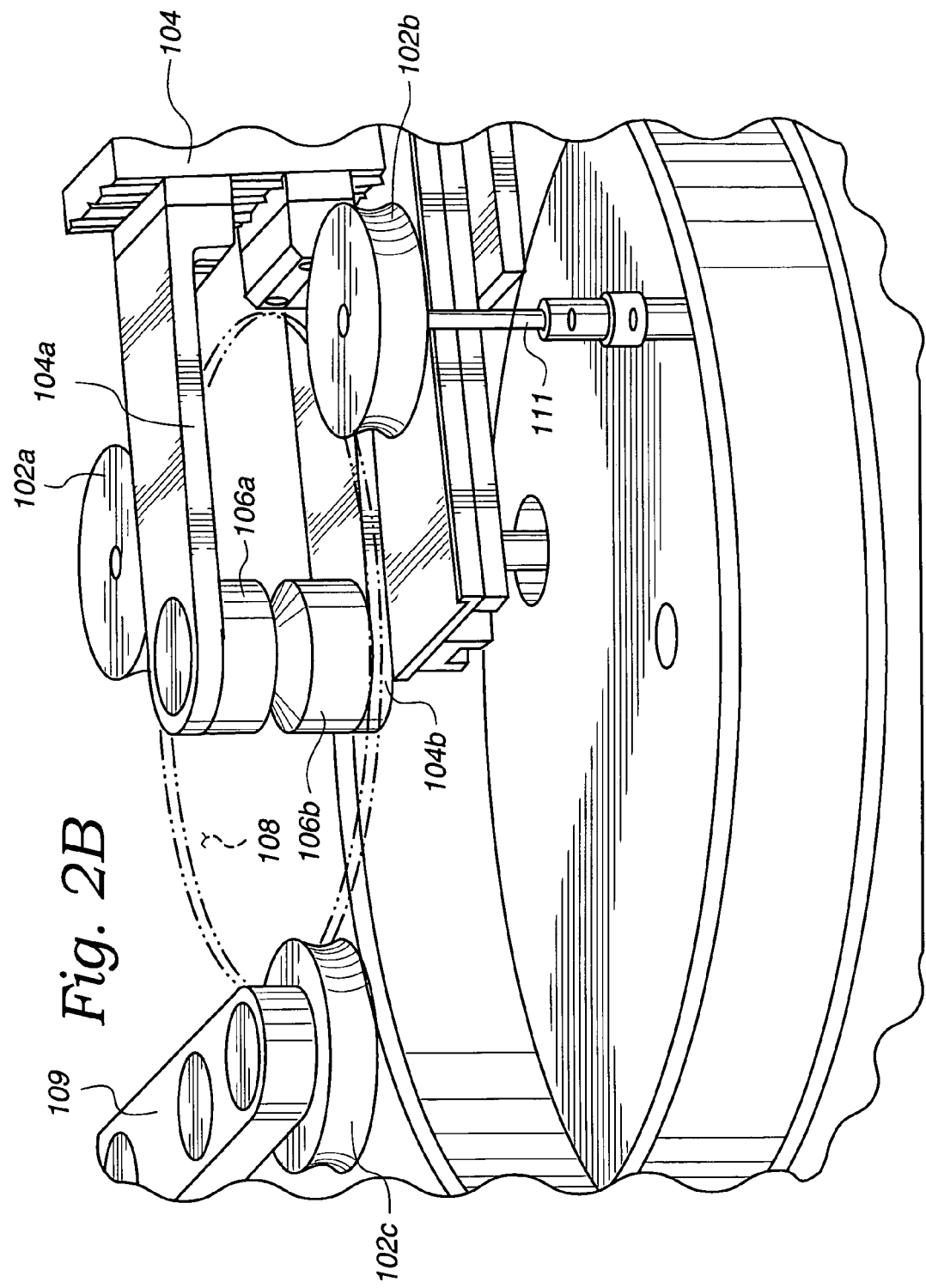

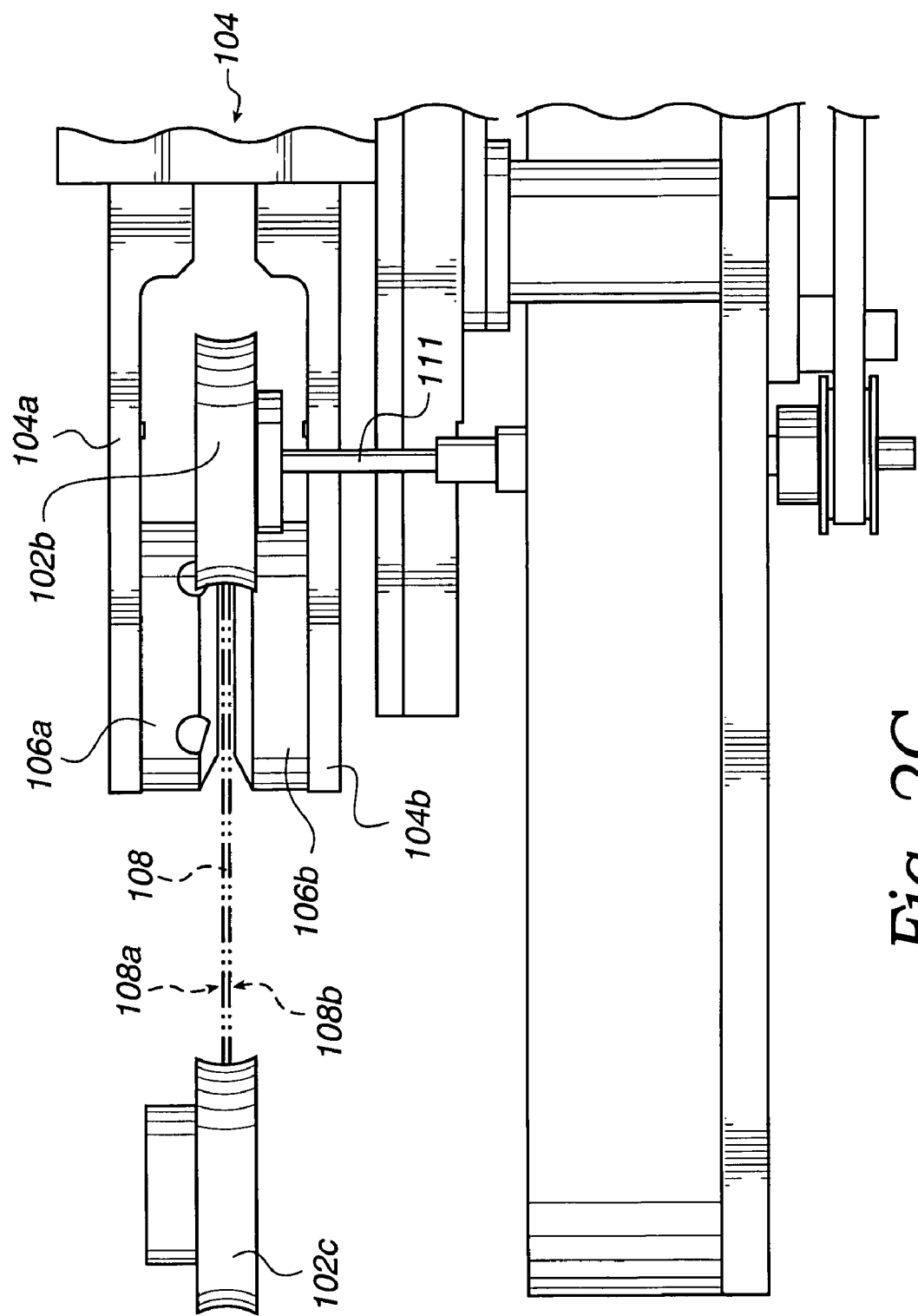

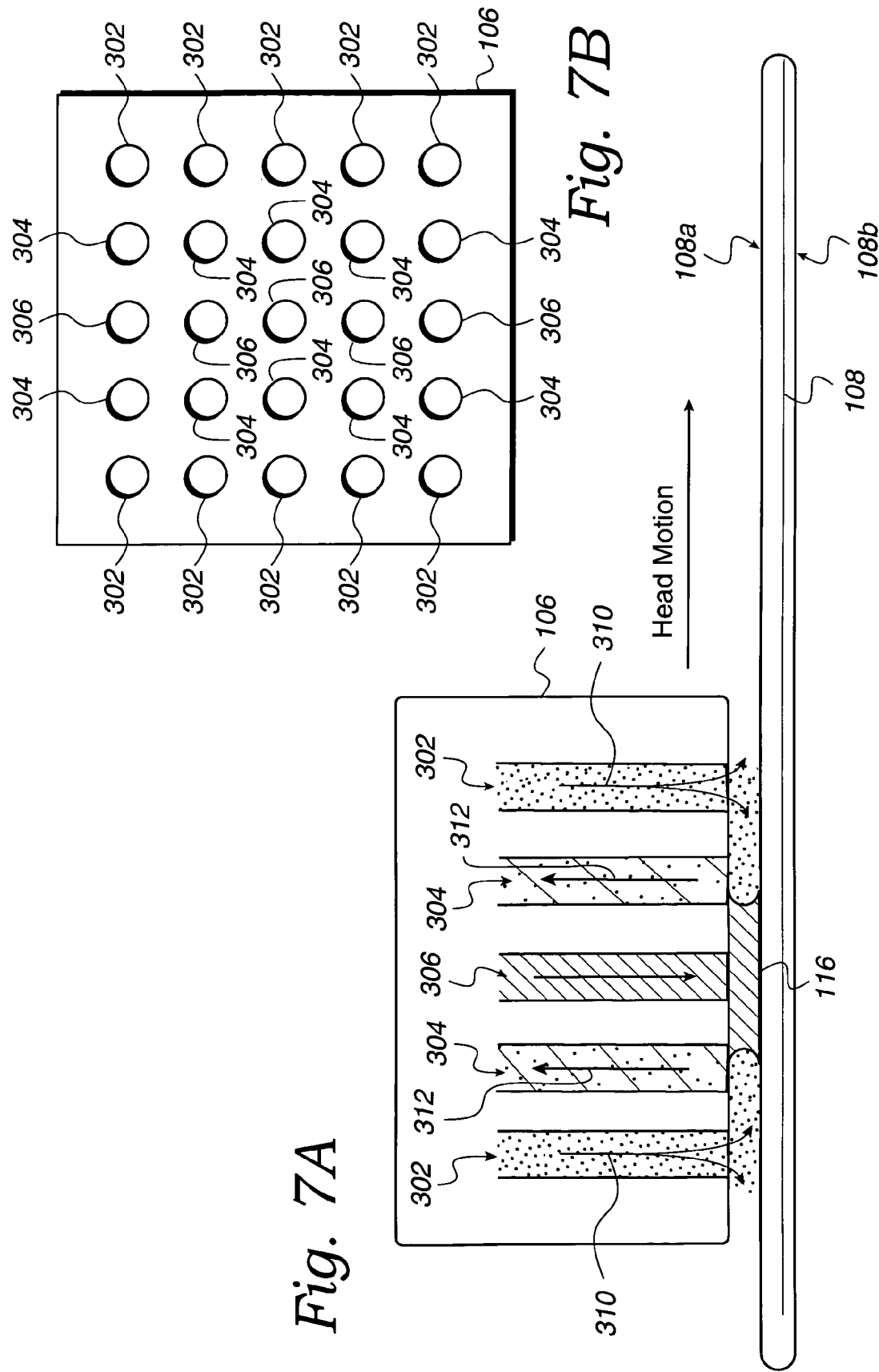

US 7,252,097 B2

SYSTEM AND METHOD FOR INTEGRATING IN-SITU METROLOGY WITHIN A WAFER PROCESS

CROSS REFERENCE TO RELATED APPLICATIONS

This application is a continuation in part of and claims priority from U.S. patent application Ser. No. 10/404,270, filed on Mar. 31, 2003 now U.S. Pat. No. 7,069,937, entitled "Vertical Proximity Processor," which is a continuation-in-part and claims priority from co-pending U.S. patent application Ser. No. 10/330,843 filed on Dec. 24, 2002 and entitled "Meniscus, Vacuum, IPA Vapor, Drying Manifold," which is a continuation-in-part of co-pending U.S. patent application Ser. No. 10/261,839 filed on Sep. 30, 2002 and entitled "Method and Apparatus for Drying Semiconductor Wafer Surfaces Using a Plurality of Inlets and Outlets Held in Close Proximity to the Wafer Surfaces." This application is also a continuation in part of U.S. patent application Ser. No. 10/330,897, filed on Dec. 24, 2002, entitled "System for Substrate Processing with Meniscus, Vacuum, IPA vapor, Drying Manifold" and is also a continuation in part of U.S. patent application Ser. No. 10/404,692 filed on Mar. 31, 2003 now U.S. Pat. No. 6,988,327, entitled Methods and Systems for Processing a Substrate Using a Dynamic Liquid Meniscus. The aforementioned patent applications are hereby incorporated by reference in their entirety.

BACKGROUND OF THE INVENTION

1. Field of the Invention

The present invention relates generally to semiconductor manufacturing processes, and more particularly, to methods and systems for efficiently monitoring and measuring a semiconductor manufacturing process.

2. Description of the Related Art

The semiconductor chip fabrication process requires numerous operations and sub-processes. Examples of such a fabrication operations include etching, chemical mechanical polishing (CMP), deposition, rinsing, drying and other operations. Each of the manufacturing operations must be monitored to make sure that the operation is completed accurately, repeatably and in a timely manner.

By way of example, in CMP, a semiconductor wafer is placed in a holder that pushes a wafer surface against a polishing surface. The polishing surface uses a slurry which consists of chemicals and abrasive materials to cause the polishing. Typically, CMP is used to remove an over burden layer to expose an underlying device layer. If the CMP process is allowed to continue too long then too much overburden material will be removed and the underlying devices can be damaged. Removing too much overburden material can also change the electrical properties of the underlying electrical devices such that their resultant electrical properties are changed beyond an acceptable range. As a result, the circuit formed by the underlying devices would fail to meet the performance goals. In the alternative, if the CMP process is stopped too early, then an insufficient quantity of the overburden material is removed. As a result, the remaining overburden material can cause unintended interconnects between the underlying devices. In CMP, typically some type of an endpoint detector or endpoint monitoring process is used to stop the CMP process in a timely manner.

Other types of manufacturing processes (e.g., etch, rinse, dry, deposition) must also have some sort of subsystem or sub-process capable of monitoring the progress of the respective manufacturing process. This is increasingly important as process control requirements become ever more stringent as device feature sizes become ever smaller and as the level of integration increases. Typically, the monitoring system or sub-process is separate from the manufacturing process. By way of example, in a wet chemical etch manufacturing process, the wet etch process is typically interrupted and the progress is evaluated as follows. The etch process is applied to the semiconductor substrate for an initial period. The semiconductor substrate is then rinsed, dried and removed from the etch process tool to be evaluated using metrology from an appropriate subsystem or sub-process to determine if the wet etch process has reached the desired goal. If the etch process has reached the desired goal (i.e., if the etch process has etched away the desired material) then a subsequent process (e.g., clean, rinse, dry) is applied to the semiconductor substrate.

Alternatively, if the wet etch process has not attained the desired goal (i.e., if the etch process has not removed all of the desired material) then the etch process is applied to the semiconductor substrate again in a rework process. After one or more iterations of the rework process, the wet etch process will remove the desired material from the semiconductor substrate. In the case of a batch processing system, a single semiconductor substrate may be used to verify the rework process required (e.g., to correct process time) before reworking the entire batch of substrates. In the case of a single semiconductor substrate processing system, a similar method could be used before committing an entire lot of substrates for rework wet etch processing.

There are numerous examples of in-situ process monitor methods that are utilized in dry plasma etch processes to provide-thickness loss measurements. These methods often use an interferometer to determine and provide film thickness change information during the etch process. This is problematic when using wet chemical processes because the film of liquid on the surface of the substrate to be measured complicates and can interfere with the measurement.

Additionally, the typical prior art subsystem or sub-process for monitoring the progress of the respective manufacturing process are inherently inefficient because the process itself must be interrupted and restarted multiple times. Starting and stopping the respective semiconductor manufacturing process can also require additional handling of the semiconductor substrate and a more complex overall semiconductor fabrication process. The additional handling and more complex process can introduce additional non-uniformities, defects or mistakes in the semiconductor manufacturing process.

In view of the foregoing, there is a need for a system and method of monitoring and quantifying the semiconductor manufacturing process results within the manufacturing process itself.

SUMMARY OF THE INVENTION

Broadly speaking, the present invention fills these needs by providing an in-situ sensor for monitoring a process being applied to a wafer. It should be appreciated that the present invention can be implemented in numerous ways, including as a process, an apparatus, a system, computer readable media, or a device. Several inventive embodiments of the present invention are described below.

One embodiment provides a method for processing a wafer. The method includes applying a process to the wafer. The process being supported by a surface tension gradient device. A result of the process is monitored. The monitored result is output. The process can also be adjusted according to the monitored results.

The process can include at least one of a group of processes consisting of a cleaning process, a rinsing process, a drying process, an etch process, a deposition process, and an electroplating process. The result of the process can be monitored by an in-situ sensor. The in-situ sensor can include at least one of a group consisting of an optical sensor and an eddy current sensor.

The surface tension gradient device can include at least one proximity head. The monitored result can be output in real time. The monitored result can be output to a process controller. The process controller can adjust the process according to the monitored results. The process controller can adjust the process in real time.

Another embodiment includes a wafer processing system. The wafer processing system can include at least one surface tension gradient device capable of supporting a process, an in-situ sensor for monitoring a result of the process, and a system controller being coupled to the in-situ sensor and the surface tension gradient device. The system controller including a process recipe.

The process can include at least one of a group of processes consisting of a cleaning process, a rinsing process, an etch process, a deposition process, and an electroplating process. The in-situ sensor can include at least one of a group consisting of an optical sensor and an eddy current sensor.

The monitored result can be output in real time. The surface tension gradient device can include a proximity head.

The process is supported within a meniscus supported by the surface tension gradient device. The in-situ sensor can be included within the surface tension gradient device. The meniscus includes a dry region subtended by the in-situ sensor.

The in-situ sensor can be moved with the surface tension gradient device. Alternatively, the in-situ sensor can be moved independent from the surface tension gradient device.

Another embodiment provides a method for processing a wafer. The method includes applying a process to the wafer. The process being supported by a proximity head. A result of the process is monitored with an in-situ sensor. The monitored result is output to a process controller in real time. A recipe for the process is adjusted in the process controller in real time according to the monitored results.

The present invention advantageously provides more precise control of the process. The more precise control allows for reduced process time and therefore increased wafer throughput over prior art processes and systems.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIG. 2B illustrates a side close-up view of the wafer processing system holding a wafer 108 in accordance with one embodiment of the present invention.

FIG. 2C shows another side close-up view of the wafer processing system in accordance with one embodiment of the present invention.

FIG. 7A illustrates a proximity head performing an exemplary drying operation in accordance with one embodiment of the present invention.

FIG. 7B shows a view of portions of a surface of a proximity head in accordance with one embodiment of the present invention.

DETAILED DESCRIPTION OF THE EXEMPLARY EMBODIMENTS

Several exemplary embodiments for a semiconductor fabrication process that utilizes a surface tension gradient and is combined with an in-situ metrology system will now be described. It will be apparent to those skilled in the art that the present invention may be practiced without some or all of the specific details set forth herein.

While this invention has been described in terms of several preferred embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

Semiconductor fabrication processes that utilize a surface tension gradient can be accomplished with a proximity head in one embodiment. Examples of a proximity head are described in the following commonly assigned patent applications which are incorporated by reference in their entirety: U.S. patent application Ser. No. 10/330,843 filed on Dec. 24, 2002 and entitled "Meniscus, Vacuum, IPA Vapor, Drying Manifold;" U.S. patent application Ser. No. 10/261,839 filed on Sep. 30, 2002 and entitled "Method and Apparatus for Drying Semiconductor Wafer Surfaces Using a Plurality of Inlets and Outlets Held in Close Proximity to the Wafer Surfaces;" U.S. patent application Ser. No. 10/330,897, filed on Dec. 24, 2002, entitled "System for Substrate Processing with Meniscus, Vacuum, IPA vapor, Drying Manifold;" U.S. patent application Ser. No. 10/404,270, filed on Mar. 31, 2003, entitled "Vertical Proximity Processor;" U.S. patent application Ser. No. 10/404,692 filed on Mar. 31, 2003, entitled Methods and Systems for Processing a Substrate Using a Dynamic Liquid Meniscus.

Figure 1:
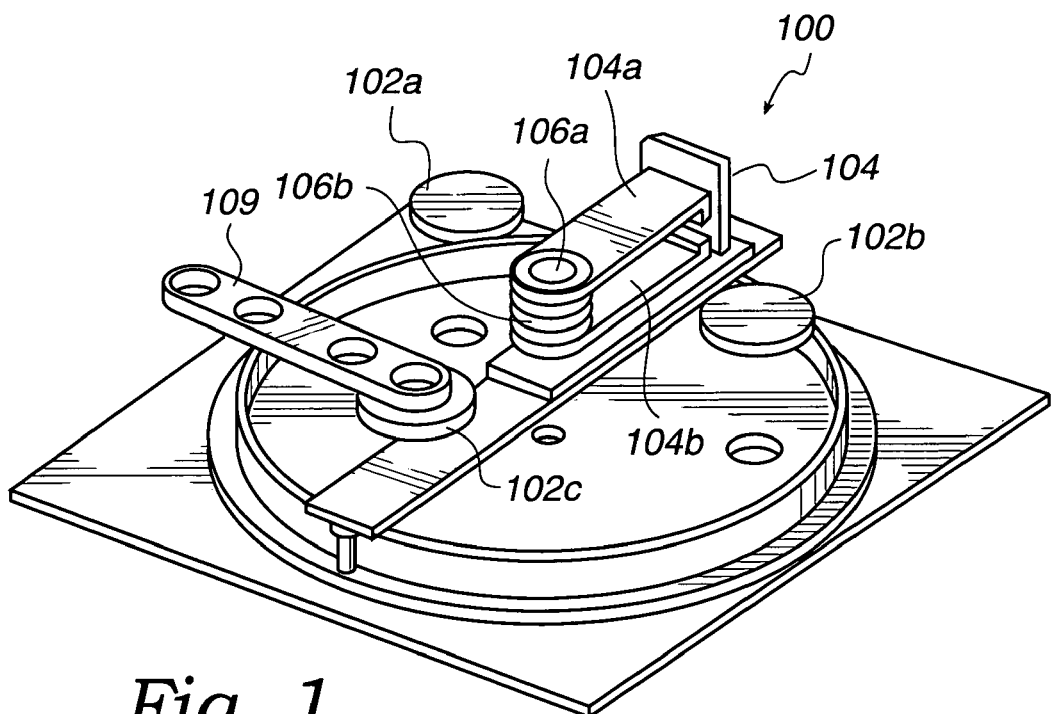
FIG. 1 shows a wafer processing system in accordance with one embodiment of the present invention.

FIGS. 1 through 2C below illustrate embodiments of an exemplary wafer processing system. It should be appreciated that the system is exemplary, and that any other suitable type of configuration that would enable movement of the proximity head(s) into close proximity to the wafer may be utilized. In the embodiments shown, the proximity head(s) may move in a linear fashion from a center portion of the wafer to the edge of the wafer. It should be appreciated that other embodiments may be utilized where the proximity head(s) move in a linear fashion from one edge of the wafer to another diametrically opposite edge of the wafer, or other non-linear movements may be utilized such as, for example, in a radial motion, in a circular motion, in a spiral motion, in a zig-zag motion, etc. The motion may also be any suitable specified motion profile as desired by a user. In addition, in one embodiment, the wafer may be rotated and the proximity head moved in a linear fashion so the proximity head may process all portions of the wafer. It should also be understood that other embodiments may be utilized where the wafer is not rotated but the proximity head is configured to move over the wafer in a fashion that enables processing of all portions of the wafer. In addition, the proximity head and the wafer processing system described herein may be utilized to process any shape and size of substrates such as for example, 200 mm wafers, 300 mm wafers, flat panels, etc. The wafer processing system may be utilized to apply any type of fabrication processes to the wafer depending on the configuration of the system.

FIG. 1 shows a wafer processing system 100 in accordance with one embodiment of the present invention. The system 100 includes rollers 102a, 102b, and 102c which may hold and rotate a wafer to enable wafer surfaces to be processed. The system 100 also includes proximity heads 106a and 106b that, in one embodiment, are attached to an upper arm 104a and to a lower arm 104b respectively. The upper arm 104a and the lower arm 104b are part of a proximity head carrier assembly 104 which enables substantially linear movement of the proximity heads 106a and 106b along a radius of the wafer.

In one embodiment the proximity head carrier assembly 104 is configured to hold the proximity head 106a above the wafer and the proximity head 106b below the wafer in close proximity to the wafer. This may be accomplished by having the upper arm 104a and the lower arm 104b be movable in a vertical manner so once the proximity heads are moved horizontally into a location to start wafer processing, the proximity heads 106a and 106b can be moved vertically to a position in close proximity to the wafer. The upper arm 104a and the lower arm 104b may be configured in any suitable way so the proximity heads 106a and 106b can be moved to enable wafer processing as described herein. It should be appreciated that the system 100 may be configured in any suitable manner as long as the proximity head(s) may be moved in close proximity to the wafer to generate and control a meniscus as discussed below in reference to FIGS. 6D through 8B. It should also be understood that close proximity may be any suitable distance from the wafer as long as a meniscus as discussed in further reference to FIGS. 6D through 8B may be maintained. In one embodiment, the proximity heads 106a and 106b (as well as any other proximity head described herein) may each be moved to between about 0.1 mm to about 10 mm from the wafer to initiate wafer processing operations. In a preferable embodiment, the proximity heads 106a and 106b (as well as any other proximity head described herein) may each be moved to between about 0.5 mm to about 4.5 mm from the wafer to initiate wafer processing operations, and in more preferable embodiment, the proximity heads 106a and 106b (as well as any other proximity head described herein) may be moved to about 2 mm from the wafer to initiate wafer processing operations.

Figure 2A:
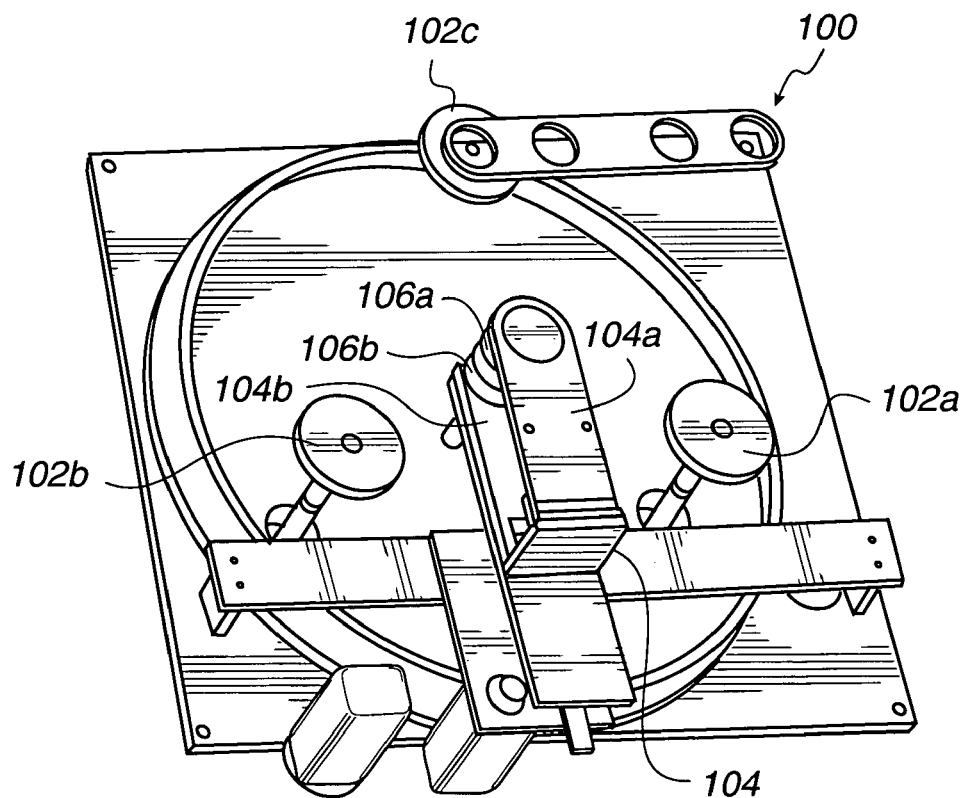
FIG. 2A shows an alternate view of the wafer processing system in accordance with one embodiment of present invention.

FIG. 2A shows an alternate view of the wafer processing system 100 in accordance with one embodiment of present invention. The system 100, in one embodiment, has the proximity head carrier assembly 104 that is configured to enable the proximity heads 106a and 106b to be moved from the center of the wafer towards the edge of the wafer. It should be appreciated that the proximity head carrier assembly 104 may be movable in any suitable manner that would enable movement of the proximity heads 106a and 106b to clean and/or dry the wafer as desired. In one embodiment, the proximity head carrier assembly 104 can be motorized to move the proximity head 106a and 106b from the center of the wafer to the edge of the wafer. It should be understood that although the wafer processing system 100 is shown with two proximity heads 106a and 106b, that any suitable number of proximity heads may be utilized such as, for example, 1, 2, 3, 4, 5, 6, etc. The proximity heads 106a and/or 106b of the wafer processing system 100 may also be any suitable size or shape as shown by, for example, any of the proximity heads as described herein. The proximity heads 106a and 106b can also be configured to move independently of one another such that each of the proximity heads can be over different portions of the surface of the wafer 108.

The different configurations described herein generate a fluid meniscus between the proximity head and the wafer. By way of example, the fluid meniscus may be moved across the wafer to clean and dry the wafer by applying fluid to the wafer surface and removing the fluids from the wafer surface. Therefore, the proximity heads 106a and 106b can have any numerous types of configurations as shown herein or other configurations that enable the processes described herein. It should also be appreciated that the system 100 may process one surface of the wafer or both the top surface and the bottom surface of the wafer.

In addition, besides processing both the top and bottom surfaces and of the wafer, the system 100 may also be configured to perform different processes on each side of the wafer if desired by inputting and outputting different types of fluids to each of the respective sides of the wafer. By way of example the system 100 can clean the front side of the wafer and dry the back side of the wafer. It should be appreciated that the system 100 may utilize the application of different chemicals top and bottom in the proximity heads 106a and 106b respectively depending on the operation desired. The proximity heads can be configured to process the bevel edge of the wafer in addition to processing the top and/or bottom of the wafer. This can be accomplished by moving the meniscus off the edge the wafer that cleans the bevel edge. It should also be understood that the proximity heads 106a and 106b may be the same type of apparatus or different types of proximity heads.

FIG. 2B illustrates a side close-up view of the wafer processing system 100 holding a wafer 108 in accordance with one embodiment of the present invention. The wafer 108 may be held and rotated by the rollers 102a, 102b, and 102c in any suitable orientation as long as the orientation enables a desired proximity head to be in close proximity to a portion of the wafer 108 that is to be processed. In one embodiment, the roller 102b may be rotated by using a spindle 111, and the roller 102c may be held and rotated by a roller arm 109. The roller 102a may also be rotated by its own spindle (as shown in FIG. 3B). In one embodiment, the rollers 102a, 102b, and 102c can rotate in a clockwise direction to rotate the wafer 108 in a counterclockwise direction. It should be understood that the rollers may be rotated in either a clockwise or a counterclockwise direction depending on the wafer rotation desired. In one embodiment, the rotation imparted on the wafer 108 by the rollers 102a, 102b, and 102c serves to move a wafer area that has not been processed into close proximity to the proximity heads 106a and 106b. In an exemplary drying operation, the wet areas of the wafer would be presented to the proximity heads 106a and 106b through both the linear motion of the proximity heads 106a and 106b and through the rotation of the wafer 108. The drying or cleaning operation itself is conducted by at least one of the proximity heads. Consequently, in one embodiment, a dry area of the wafer 108 would expand from a center region to the edge region of the wafer 108 in a spiral movement as a drying operation progresses. In a preferable embodiment, the dry area of the wafer 108 would move around the wafer 108 and the wafer 108 would be dry in one rotation (if the length of the proximity heads 106a and 106b are at least a radius of the wafer 108). By changing the configuration of the system 100 and the orientation of and movement of the proximity head 106a and/or the proximity head 106b, the drying movement may be changed to accommodate nearly any suitable type of drying path.

It should be understood that the proximity heads 106a and 106b may be configured to have at least one of first source inlet configured to input deionized water (DIW) or other process chemistry (also known as a DIW inlet), at least one of a second source inlet configured to input isopropyl alcohol (IPA) in vapor form (also known as IPA inlet), and at least one source outlet configured to output fluids from a region between the wafer and a particular proximity head by applying vacuum (also known as vacuum outlet). It should be appreciated that the vacuum utilized herein may also be suction. In addition, other types of solutions may be inputted into the first source inlet and the second source inlet such as, for example, etching chemistries, photoresist wet stripping chemistries, cleaning solutions, ammonia, HF, etc. It should be appreciated that although IPA vapor is used in some of the exemplary embodiments, other tensio-active substance (substances that provide or increase or decrease a surface tension gradient between a substrate-liquid interface) and nitrogen or other inert carrier gas may be used to carry the tension-active vapor. Alternatives for IPA include but are not limited to the following: diacetone, diaceton alcohol, 1-methoxy-2-propanol, ethylglycol, methyl-pyrrolidon, ethyllactate, 2-butanol. In addition, any other type of vapor or gas may be utilized such as for example, nitrogen, argon or other gases, any suitable alcohol vapor, organic compounds, etc. that may be miscible with water.

In one embodiment, the at least one IPA vapor inlet is adjacent to the at least one vacuum outlet which is in turn adjacent to the at least one DIW inlet to form an IPA-vacuum-DIW orientation. It should be appreciated that other types of orientations such as IPA-DIW-vacuum, DIW-vacuum-IPA, vacuum-IPA-DIW, etc. may be utilized depending on the wafer process that is sought to be enhanced. In a preferable embodiment, the IPA-vacuum-DIW orientation may be utilized to intelligently generate, control, and move the meniscus located between a proximity head and a wafer to clean and dry wafers. The DIW inlets, the IPA vapor inlets, and the vacuum outlets may be arranged in any suitable manner if the above orientation is maintained. For example, in addition to the IPA vapor inlet, the vacuum outlet, and the DIW inlet, in an additional embodiment, there may be additional sets of IPA vapor outlets, DIW inlets and/or vacuum outlets depending on the configuration of the proximity head desired. Therefore, another embodiment may utilize an IPA-vacuum-DIW-DIW-vacuum-IPA or other exemplary embodiments with an IPA source inlet, vacuum source outlet, and DIW source inlet configurations are described herein with a preferable embodiment being described in reference to FIG. 6D. It should be appreciated that the exact configuration of the IPA-vacuum-DIW orientation may be varied depending on the application. For example, the distance between the IPA input, vacuum, and DIW input locations may be varied so the distances are consistent or so the distances are inconsistent. In addition, the distances between the IPA input, vacuum, and DIW output may differ in magnitude depending on the size, shape, and configuration of the proximity head 106*a* and the desired size of a process window (i.e., meniscus shape and size) as described in further detail in reference to FIGS. 9A and 9B. In addition, as discussed in reference to FIGS. 9A and 9B, the IPA-vacuum-DIW orientation is configured so a vacuum region substantially surrounds a DIW region and the IPA region substantially surrounds at least the trailing edge region of the vacuum region.

FIG. 2C shows another side close-up view of the wafer processing system 100 in accordance with one embodiment of the present invention. In this embodiment, the proximity heads 106*a* and 106*b* have been positioned in close proximity to a top surface 108*a* and a bottom surface 108*b* of the wafer 108 respectively by utilization of the proximity head carrier assembly 104. Once in this position, the proximity heads 106*a* and 106*b* may utilize the IPA and DIW source inlets and a vacuum source outlet(s) to generate wafer processing meniscuses in contact with the wafer 108 which are capable of removing fluids from a top surface 108*a* and a bottom surface 108*b*. The wafer processing meniscus may be generated in accordance with the descriptions in reference to FIGS. 6A through 9B where IPA vapor and DIW are inputted into the region between the wafer 108 and the proximity heads 106*a* and. 106*b*. At substantially the same time the IPA and DIW is inputted, a vacuum may be applied in close proximity to the wafer surface to output the IPA vapor, the DIW, and the fluids that may be on a wafer surface. It should be appreciated that although IPA is utilized in the exemplary embodiment, any other suitable type of vapor may be utilized such as any suitable alcohol vapor, organic compounds, hexanol, ethyl glycol, etc. that may be miscible with water. These fluids may also be known as surface tension reducing fluids. The surface tension reducing fluids act to increase the surface tension gradient between the two surfaces (i.e., the proximity head and the surface of the wafer).

The portion of the DIW that is in the region between the proximity head and the wafer is the meniscus. It should be appreciated that as used herein, the term "output" can refer to the removal of fluid from a region between the wafer 108 and a particular proximity head, and the term "input" can be the introduction of fluid to the region between the wafer 108 and the particular proximity head.

In another exemplary embodiment, the proximity heads 106*a* and 106*b* may be moved in a manner so all parts of the wafer 108 are processed without the wafer 108 being rotated. In such an embodiment, the proximity head carrier assembly 104 may be configured to enable movement of the either one or both of the proximity heads 106*a* and 106*b* to close proximity of any suitable region of the wafer 108. In one embodiment, of the proximity heads are smaller in length than a radius of the wafer, the proximity heads may be configured to move in a spiral manner from the center to the edge of the wafer 108 or vice versa. In a preferable embodiment, when the proximity heads are larger in length than a radius of the wafer, the proximity heads 106*a* and 106*b* may be moved over the entire surface of the wafer in one rotation. In another embodiment, the proximity heads 106*a* and 106*b* may be configured to move in a linear fashion back and forth across the wafer 108 so all parts of the wafer surfaces 108*a* and/or 108*b* may be processed. In yet another embodiment, configurations as discussed below in reference to FIGS. 5C through 5H may be utilized. Consequently, countless different configurations of the system 100 may be utilized in order to obtain an optimization of the wafer processing operation.

Figure 3A:
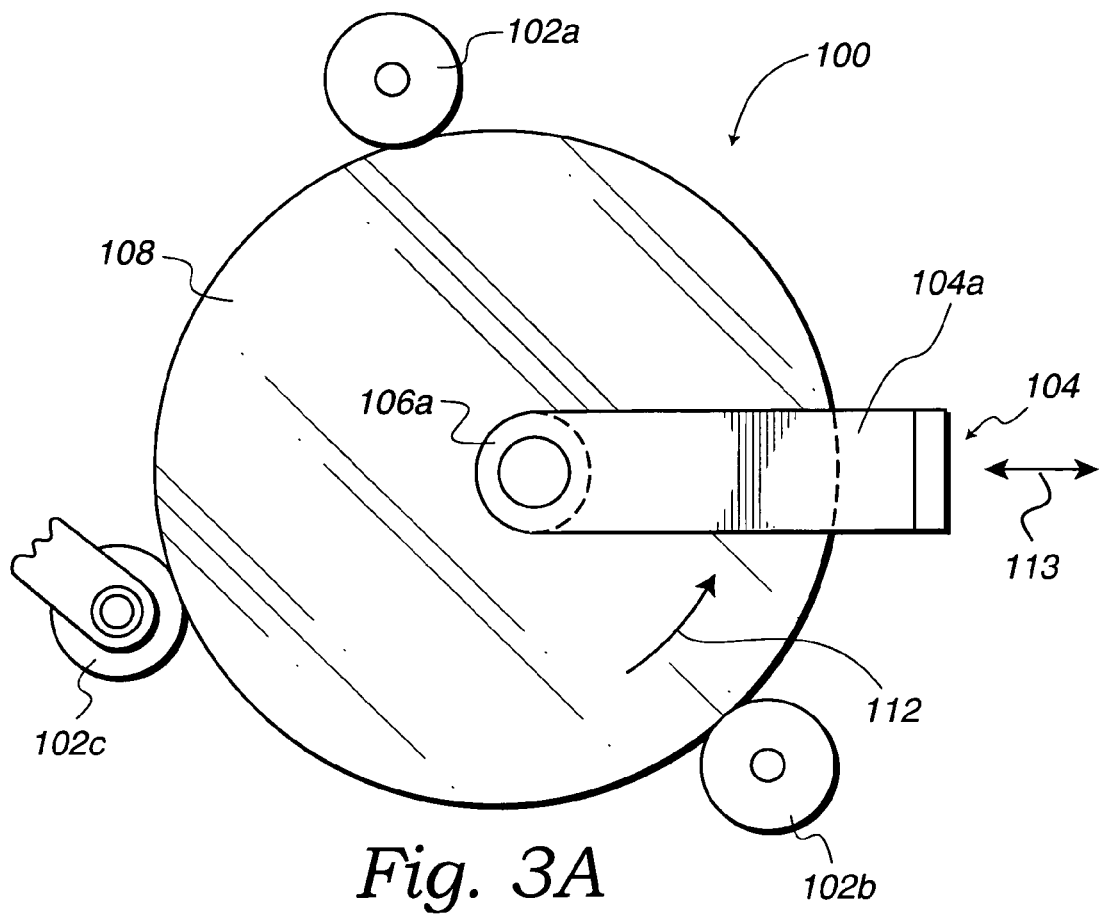
FIG. 3A shows a top view illustrating the wafer processing system with dual proximity heads in accordance with one embodiment of the present invention.
Figure 3B:
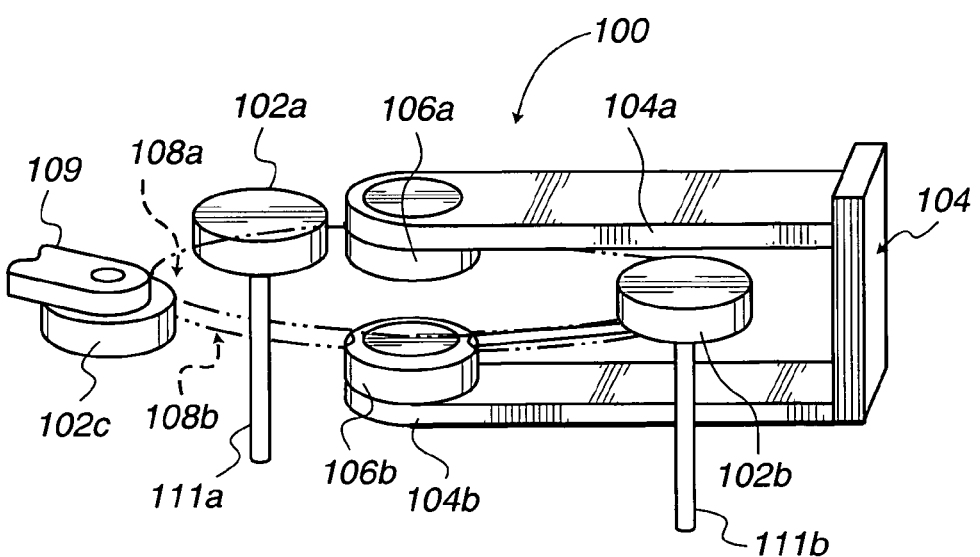
FIG. 3B illustrates a side view of the wafer processing system with dual proximity heads in accordance with one embodiment of the present invention.

FIG. 3A shows a top view illustrating the wafer processing system 100 with dual proximity heads in accordance with one embodiment of the present invention. As described above in reference to FIGS. 1 to 2C, the upper arm 104*a* may be configured to move and hold the proximity head 106*a* in a position in close proximity over the wafer 108. The upper arm 104*a* may also be configured to move the proximity head 106*a* from a center portion of the wafer 108 towards the edge of the wafer 108 in a substantially linear fashion 113. Consequently, in one embodiment, as the wafer 108 rotates in the direction 112, the proximity head 106*a* is capable of moving and removing a fluid film from the top surface 108*a* of the wafer 108 using a process described in further detail in reference to FIGS. 6A through 8B below. Therefore, the proximity head 106*a* may process the wafer 108 in a substantially spiral path over the wafer 108. In another embodiment as shown in reference to FIG. 3B, a second proximity head can be located below the wafer 108 to perform a process on the bottom surface 108*b* of the wafer 108.

FIG. 3B illustrates a side view of the wafer processing system 100 with dual proximity heads in accordance with one embodiment of the present invention. In this embodiment, the system 100 includes both the proximity head 106*a* capable of processing a top surface of the wafer 108 and the proximity head 106*b* capable of processing a bottom surface of the wafer 108. In one embodiment, spindles 111*a* and 111*b* along with a roller arm 109 may rotate the rollers 102*a*, 102*b*, and 102*c* respectively. This rotation of the rollers 102*a*, 102*b*, and 102*c* may rotate the wafer 108 so substantially all surfaces of the wafer 108 may be presented to the proximity heads 106*a* and 106*b* for drying and/or cleaning. In one embodiment, while the wafer 108 is being rotated, the proximity heads 106*a* and 106*b* are brought to close proximity of the wafer surfaces 108*a* and 108*b* by the arms 104*a* and 104*b* respectively. Once the proximity heads 106*a* and 106*b* are brought into close proximity to the wafer 108, the wafer processing may be begun. In operation, the proximity heads 106*a* and 106*b* may each move/remove processing fluids from the wafer 108 by applying IPA, deionized water and vacuum to the top surface and the bottom surface of the wafer 108 as described in reference to FIGS. 6A-6F below.

In one embodiment, by using the proximity heads 106*a* and 106*b*, the system 100 may, for example, dry a 200 mm wafer in less than 45 seconds. In another embodiment, where the proximity heads 106*a* and 106*b* are at least a radius of the wafer in length, the drying time for a wafer may be less than 30 seconds. It should be understood that processing time may be decreased by increasing the speed at which the proximity heads 106*a* and 106*b* travels from the center of the wafer 108 to the edge of the wafer 108. In another embodiment, the proximity heads 106*a* and 106*b* may be utilized with a faster wafer rotation to process the wafer 108 in less time. In yet another embodiment, the rotation of the wafer 108 and the movement of the proximity heads 106*a* and 106*b* may be adjusted in conjunction to obtain an optimal processing speed. In one embodiment, the proximity heads 106*a* and 106*b* may move linearly from a center region of the wafer 108 to the edge of the wafer 108 at between about 0 mm per second to about 50 mm per second.

Figure 4A:
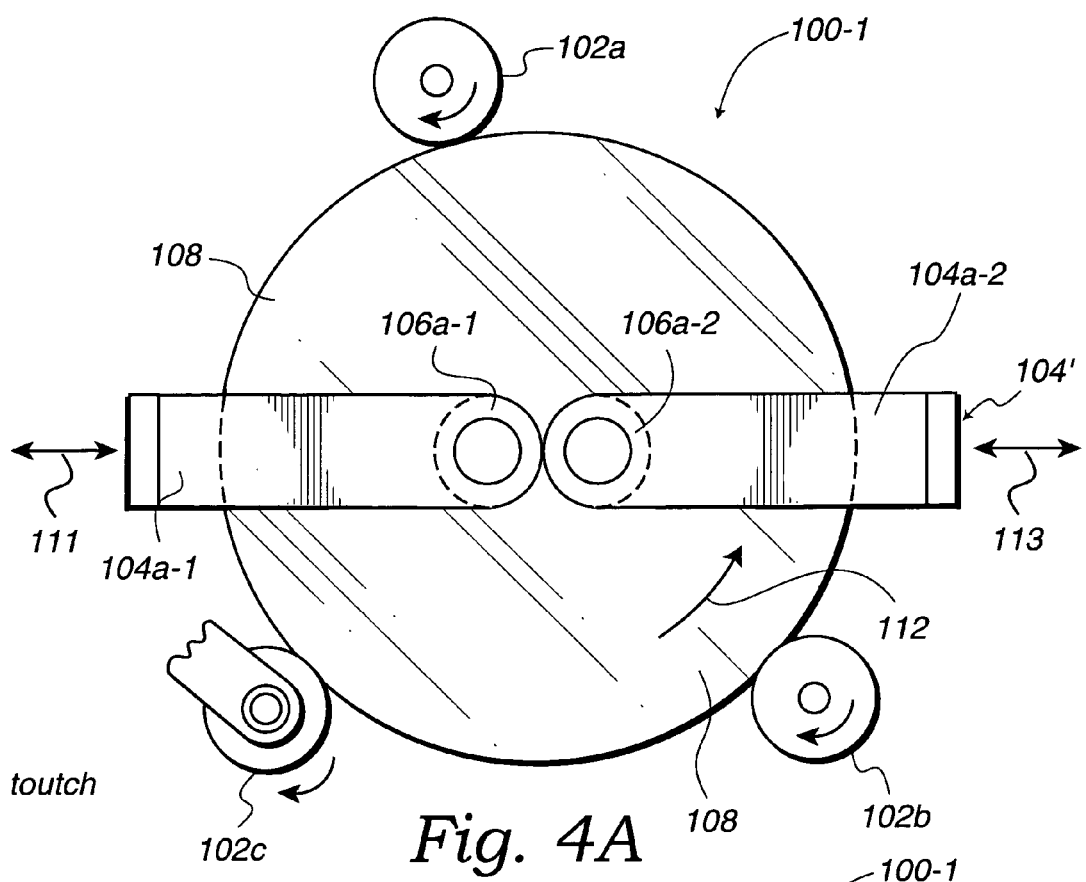
FIG. 4A shows a top view of a wafer processing system which includes multiple proximity heads for a particular surface of the wafer in accordance with one embodiment of the present invention.
Figure 4B:
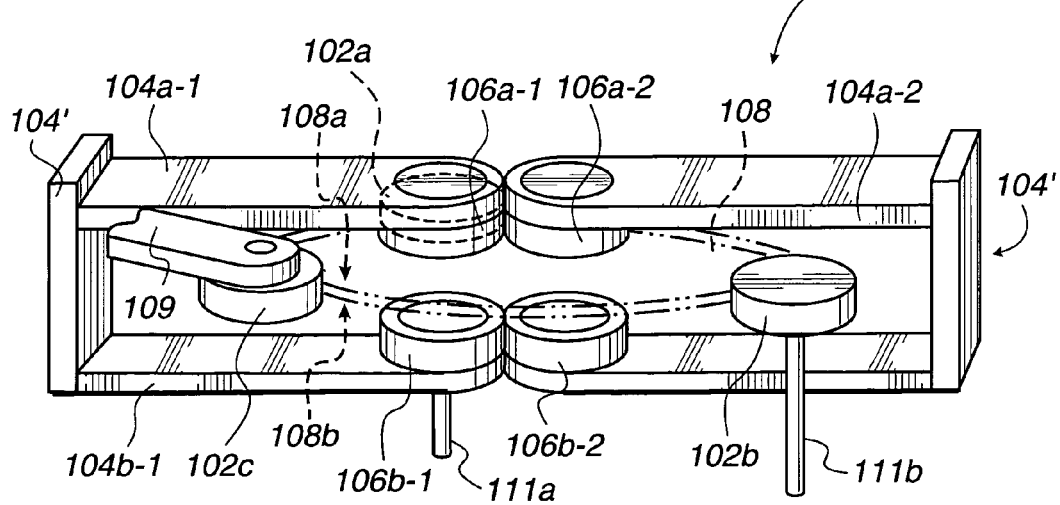
FIG. 4B shows a side view of the wafer processing system which includes multiple proximity heads for a particular surface of the wafer in accordance with one embodiment of the present invention.

FIG. 4A shows a top view of a wafer processing system 100-1 which includes multiple proximity heads for a particular surface of the wafer 108 in accordance with one embodiment of the present invention. In this embodiment, the system 100-1 includes an upper arm 104*a*-1 and an upper arm 104*a*-2. As shown in FIG. 4B, the system 100-1 also may include lower arm 104*b*-1 and lower arm 104*b*-2 connected to proximity heads 106*b*-1 and 106*b*-2 respectively. In the system 100-1, the proximity heads 106*a*-1 and 106*a*-2 (as well as 106*b*-1 and 106*b*-2 if top and bottom surface processing is being conducted) work in conjunction so, by having two proximity heads processing a particular surface of the wafer 108, processing time may be cut to about half of the time. Therefore, in operation, while the wafer 108 is rotated, the proximity heads 106*a*-1, 106*a*-2, 106*b*-1, and 106*b*-2 start processing the wafer 108 near the center of the wafer 108 and move outward toward the edge of the wafer 108 in a substantially linear fashion. In this way, as the rotation 112 of the Wafer 108 brings all regions of the wafer 108 in proximity with the proximity heads so as to process all parts of the wafer 108. Therefore, with the linear movement of the proximity heads 106*a*-1, 106*a*-2, 106*b*-1, and 106*b*-2 and the rotational movement of the wafer 108, the wafer surface being processed moves in a spiral fashion from the center of the wafer 108 to the edge of the wafer 108.

In another embodiment, the proximity heads 106*a*-11 and 106*b*-1 may start processing the wafer 108 and after they have moved away from the center region of the wafer 108, the proximity heads 106*a*-2 and 106*b*-2 may be moved into place in the center region of the wafer 108 to augment in wafer processing operations. Therefore, the wafer processing time may be decreased significantly by using multiple proximity heads to process a particular wafer surface.

FIG. 4B shows a side view of the wafer processing system 100-1 which includes multiple proximity heads for a particular surface of the wafer 108 in accordance with one embodiment of the present invention. In this embodiment, the system 100-1 includes both the proximity heads 106*a*-1 and 106*a*-2 that are capable of processing the top surface 108*a* of the wafer 108, and proximity heads 106*b*-1 and 106*b*-2 capable of processing the bottom surface 108*b* of the wafer 108. As in the system 100, the spindles 111*a* and 111*b* along with a roller arm 109 may rotate the rollers 102*a*, 102*b*, and 102*c* respectively. This rotation of the rollers 102*a*, 102*b*, and 102*c* may rotate the wafer 108 so substantially all surfaces of the wafer 108 may be brought in close proximity to the proximity heads 106*a*-1, 106*a*-2, 106*b*-1, and 106*b*-2 for wafer processing operations.

In operation, each of the proximity heads 106*a*-1, 106*a*-2, 106*b*-1, and 106*b*-2 may apply/move/remove processing fluids from the wafer 108 by applying IPA, deionized water and vacuum to the top surface and the bottom surface of the wafer 108 as shown, for example, in FIGS. 6A through 8B. By having two proximity heads per wafer side, the wafer processing operation (i.e., cleaning, drying, etching, deposition, etc.) may be accomplished in substantially less time. It should be appreciated that as with the wafer processing system described in reference to FIGS. 3A and 3B, the speed of the wafer rotation may be varied to any suitable speed as long as the configuration enables proper wafer processing. In one embodiment, the wafer processing time may be decreased when half a rotation of the wafer 108 is used to process the entire wafer. In such an embodiment, the wafer processing speed may be about half of the processing speed when only one proximity head is utilized per wafer side.

Figure 5A:
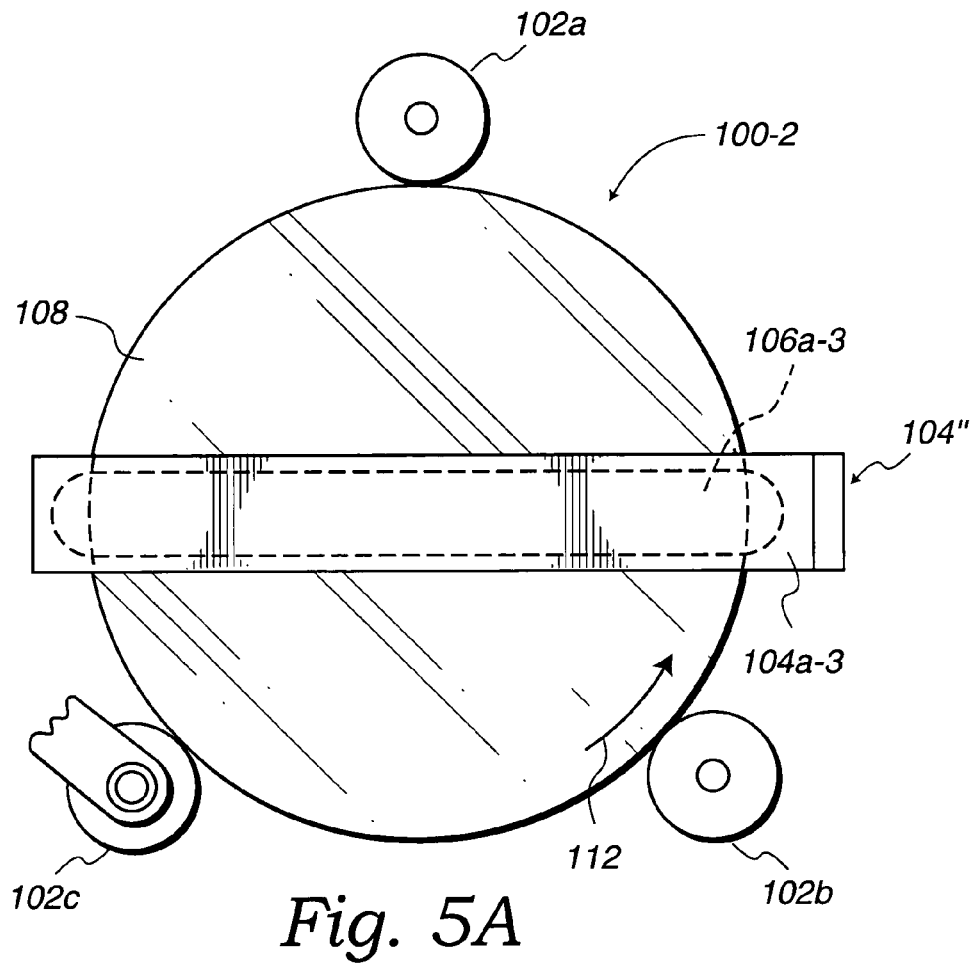
FIG. 5A shows a top view of a wafer processing system with a proximity head in a horizontal configuration that extends across a diameter of the wafer in accordance with one embodiment of the present invention.

FIG. 5A shows a top view of a wafer processing system 100-2 with a proximity head 106*a*-3 in a horizontal configuration that extends across a diameter of the wafer 108 in accordance with one embodiment of the present invention. In this embodiment, the proximity head 106*a*-3 is held by an upper arm 104*a*-3 that extends across a diameter of the wafer 108. In this embodiment, the proximity head 106*a*-3 may be moved into a processing position by a vertical movement of the upper arm 104*a*-3 so the proximity head 106*a*-3 can be in a position that is in close proximity to the wafer 108. Once the proximity head 106*a*-3 is in close proximity to the wafer 108, the wafer processing operation of a top surface of the wafer 108 can take place.

Figure 5B:
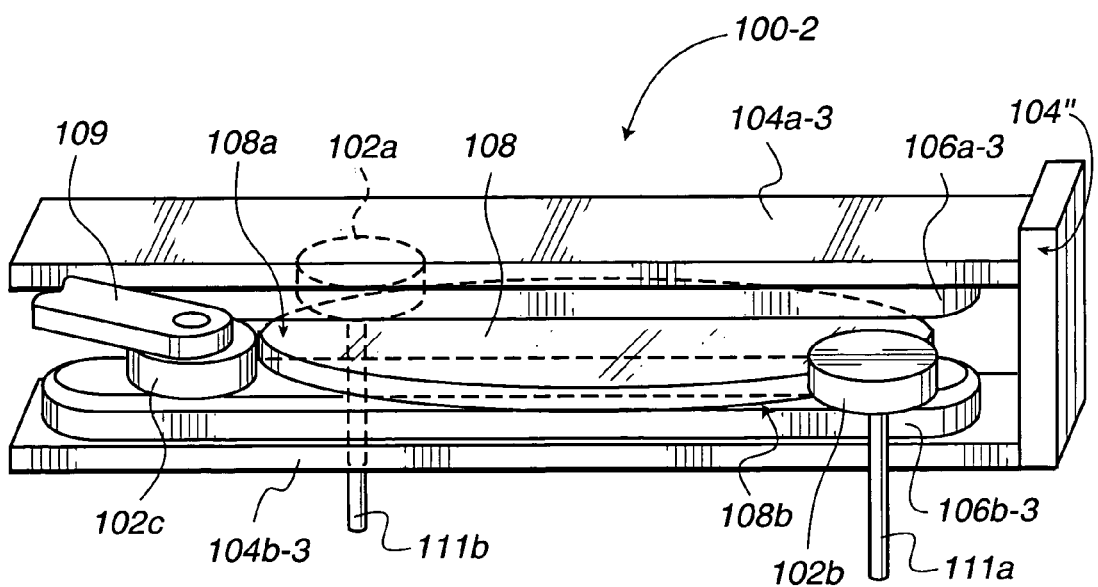
FIG. 5B shows a side view of a wafer processing system with the proximity heads in a horizontal configuration that extends across a diameter of the wafer in accordance with one embodiment of the present invention.

FIG. 5B shows a side view of a wafer processing system 100-2 with the proximity heads 106*a*-3 and 106*b*-3 in a horizontal configuration that extends across a diameter of the wafer 108 in accordance with one embodiment of the present invention. In this embodiment, the proximity head 106*a*-3 and the proximity head 106*b*-3 both are sufficiently elongated to be able to span the diameter of the wafer 108. In one embodiment, while the wafer 108 is being rotated, the proximity heads 106*a*-3 and 106*b*-3 are brought to close proximity of the wafer surfaces 108*a* and 108*b* by the top arm 104*a* and a bottom arm 106*b*-3 respectively. Because the proximity heads 106*a*-3 and 106*b*-3 extend across the wafer 108, only half of a full rotation may be needed to process the wafer 108.

Figure 5C:
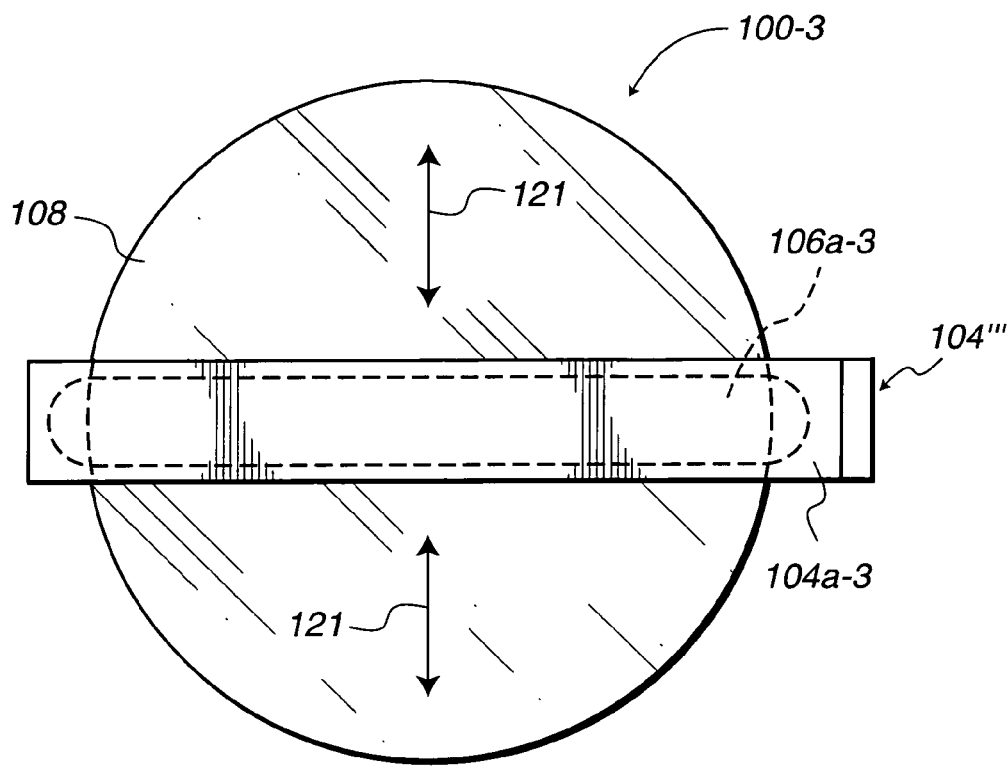
FIG. 5C shows a top view of a wafer processing system with the proximity heads in a horizontal configuration which is configured to apply one or more fabrication processes to the wafer that is stationary, in accordance with one embodiment of the present invention.

FIG. 5C shows a top view of a wafer processing system 100-3 with the proximity heads 106*a*-3 and 106*b*-3 in a horizontal configuration which is configured to apply one or more fabrication processes to the wafer 108 that is stationary, in accordance with one embodiment of the present invention. In this embodiment, the wafer 108 may be held stationary by any suitable type of wafer holding device such as, for example, an edge grip, fingers with edge attachments, etc. The proximity head carrier assembly 104′′′ is configured to be movable from one edge of the wafer 108 across the diameter of the wafer 108 to an edge on the other side of the wafer 108 after crossing the entire wafer diameter. In this fashion, the proximity head 106a-3 and/or the proximity head 106b-3 (as shown below in reference to FIG. 5D) may move across the wafer following a path along a diameter of the wafer 108 from one edge to an opposite edge. It should be appreciated that the proximity heads 106a-3 and/or 106b-3 may be move from any suitable manner that would enable moving from one edge of the wafer 108 to another diametrically opposite edge. In one embodiment, the proximity head 106a-3 and/or the proximity head 106b-3 may move in directions 121 (e.g., top to bottom or bottom to top of FIG. 5C). Therefore, the wafer 108 may stay stationary without any rotation or movement and the proximity heads 106a-3 and/or the proximity head 106b-3 may move into close proximity of the wafer and, through one pass over the wafer 108, process the top and/or bottom surface of the wafer 108.

Figure 5D:
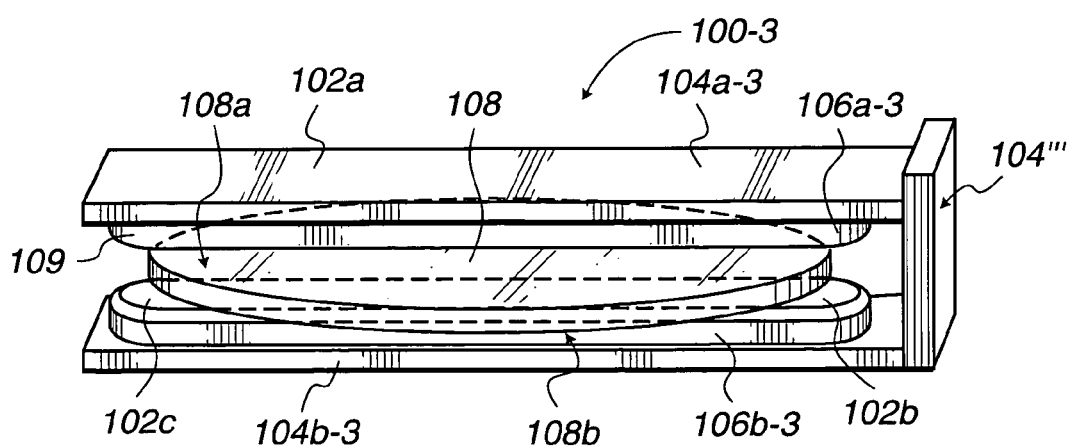
FIG. 5D shows a side view of a wafer processing system with the proximity heads in a horizontal configuration which is configured to process the wafer that is stationary in accordance with one embodiment of the present invention.

FIG. 5D shows a side view of a wafer processing system 100-3 with the proximity heads 106a-3 and 106b-3 in a horizontal configuration which is configured to process the wafer 108 that is stationary in accordance with one embodiment of the present invention. In this embodiment, the proximity head 106a-3 is in a horizontal position with the wafer 108 also in a horizontal position. By use of the proximity head 106a-3 and the proximity head 106b-3 that spans at least the diameter of the wafer 108, the wafer 108 may be processed in one pass by moving proximity heads 106a-3 and 106b-3 in the direction 121 as discussed in reference to FIG. 5C.

Figure 5E:
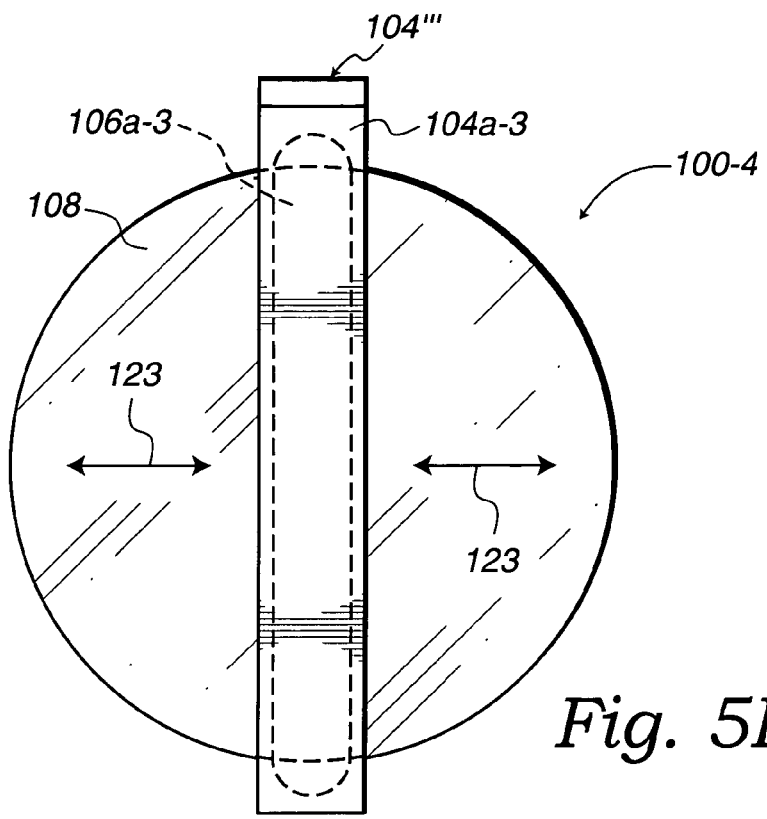
FIG. 5E shows a side view of a wafer processing system with the proximity heads in a vertical configuration enabled to process the wafer that is stationary in accordance with one embodiment of the present invention.

FIG. 5E shows a side view of a wafer processing system 1004 with the proximity heads 106a-3 and 106b-3 in a vertical configuration enabled to process the wafer 108 that is stationary in accordance with one embodiment of the present invention. In this embodiment, the proximity heads 106a-3 and 106b-3 are in a vertical configuration, and the proximity heads 106a-3 and 106b-3 are configured to move either from left to right, or from right to left, beginning from a first edge of the wafer 108 to a second edge of the wafer 108 that is diametrically opposite to the first edge. Therefore, in such as embodiment, the proximity head carrier assembly 104′′′ may move the proximity heads 104a-3 and 104b-3 in close proximity with the wafer 108 and also enable the movement of the proximity heads 104a-3 and 104b-3 across the wafer from one edge to another so the wafer 108 may be processed in one pass thereby decreasing the time to process the wafer 108.

Figure 5F:
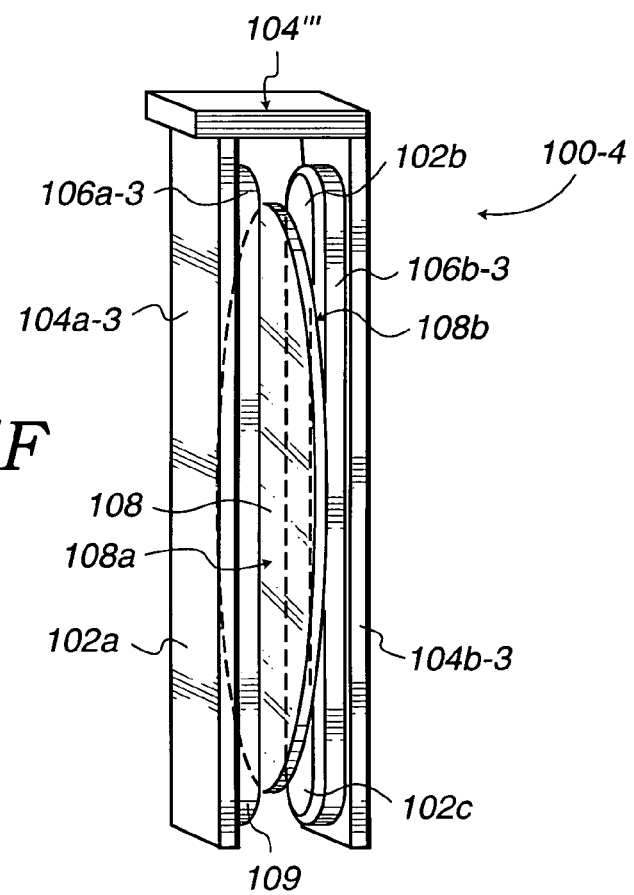
FIG. 5F shows an alternate side view of a wafer processing system that is shifted 90 degrees from the side view shown in FIG. 5E in accordance with one embodiment of the present invention.

FIG. 5F shows an alternate side view of a wafer processing system 1004 that is shifted 90 degrees from the side view shown in FIG. 5E in accordance with one embodiment of the present invention. It should be appreciated that the proximity head carrier assembly 104′′′ may be oriented in any suitable manner such as for example, having the proximity head carrier assembly 104′′′ rotated 180 degrees as compared with what is shown in FIG. 5F.

Figure 5G:
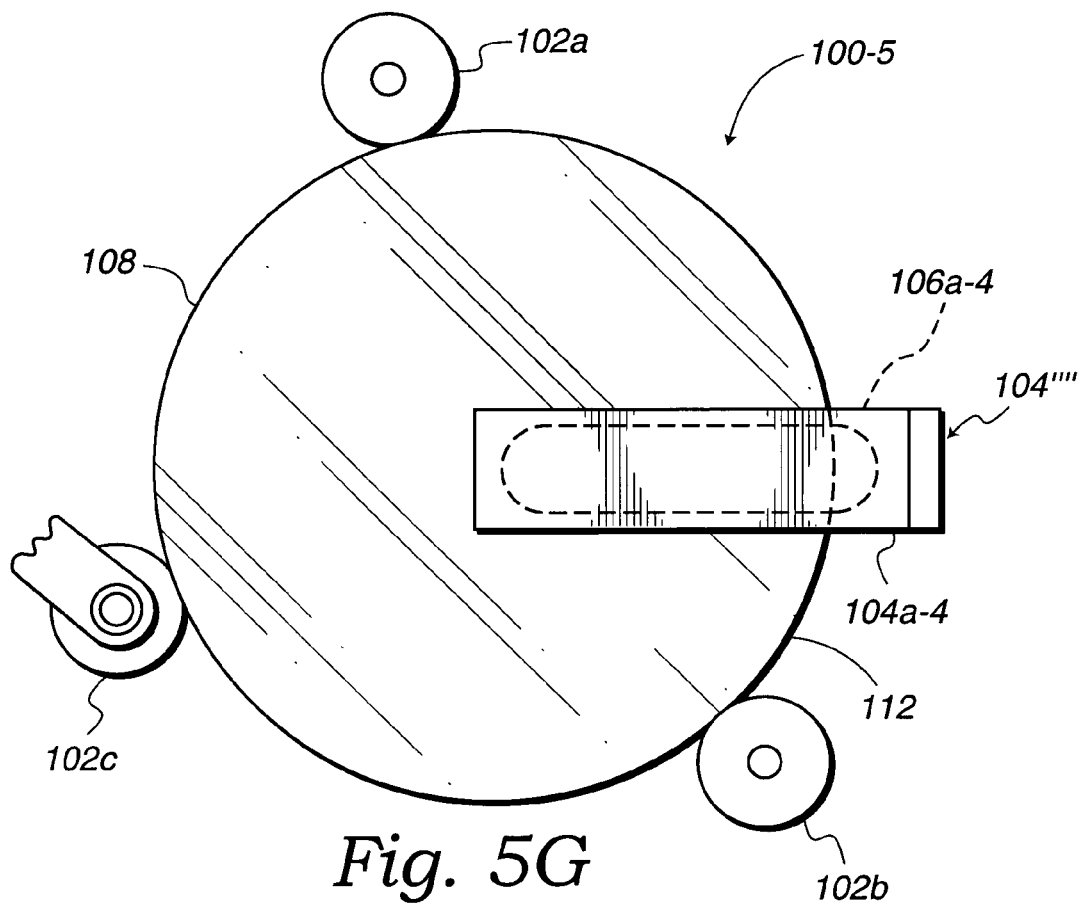
FIG. 5G shows a top view of a wafer processing system with a proximity head in a horizontal configuration which extends across a radius of the wafer in accordance with one embodiment of the present invention.

FIG. 5G shows a top view of a wafer processing system 100-5 with a proximity head 106a-4 in a horizontal configuration which extends across a radius of the wafer 108 in accordance with one embodiment of the present invention. In one embodiment, the proximity head 106a4 extends across less than a radius of a substrate being processed. In another embodiment, the proximity head 106a4 may extend the radius of the substrate being processed. In a preferable embodiment, the proximity head 106a-4 extends over a radius of the wafer 108 so the proximity head may process both the center point of the wafer 108 as well as an edge of the wafer 108 so the proximity head 106a-4 can cover and process the center point of the wafer and the edge of the wafer. In this embodiment, the proximity head 106a-4 may be moved into a processing position by a vertical movement of the upper arm 104a4 so the proximity head 106a-4 can be in a position that is in close proximity to the wafer 108. Once the proximity head 106a4 is in close proximity to the wafer 108, the wafer processing operation of a top surface of the wafer 108 can take place. Because, in one embodiment, the proximity head 106a4 extends over the radius of the wafer, the wafer may be processed in one rotation.

Figure 5H:
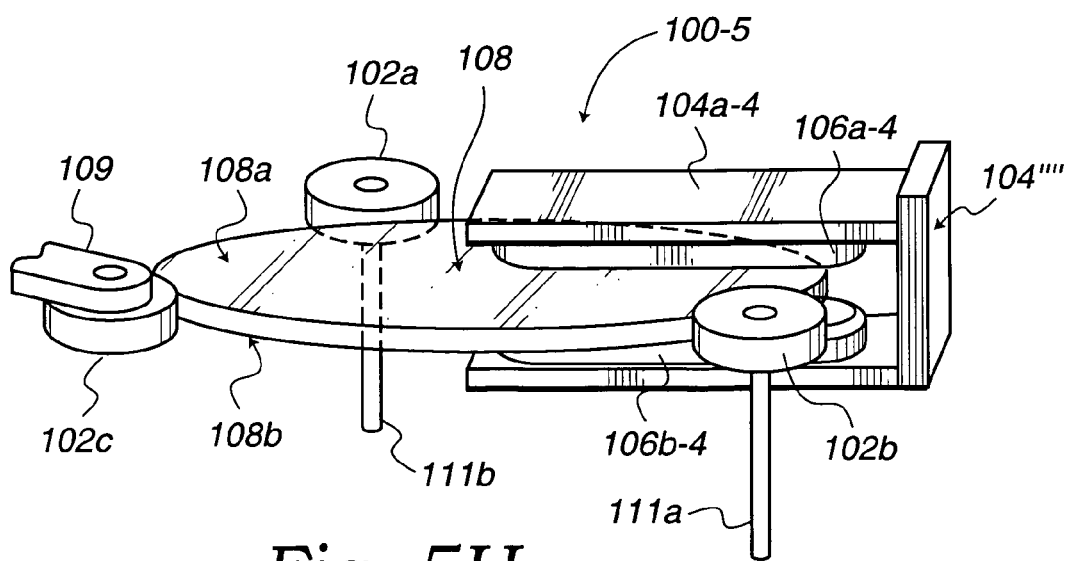
FIG. 5H shows a side view of a wafer processing system with the proximity heads in a horizontal configuration that extends across a radius of the wafer in accordance with one embodiment of the present invention.

FIG. 5H shows a side view of a wafer processing system 100-5 with the proximity heads 106a4 and 106b-4 in a horizontal configuration that extends across a radius of the wafer 108 in accordance with one embodiment of the present invention. In this embodiment, the proximity head 106a-4 and the proximity head 106b-4 both are elongated to be able to extend over and beyond the radius of the wafer 108. As discussed in reference to FIG. 5G, depending on the embodiment desired, the proximity head 106a-4 may extend less than a radius, exactly a radius, or greater than a radius of the wafer 108. In one embodiment, while the wafer 108 is being rotated, the proximity heads 106a-4 and 106b-4 are brought to close proximity of the wafer surfaces 108a and 108b by the top arm 104a and a bottom arm 106b-4 respectively. Because in one embodiment, the proximity heads 106a-4 and 106b-4 extend across greater than the radius of the wafer 108, only a full rotation may be needed to process the wafer 108.

Devices and surfaces such as the proximity heads 106a-5 and 106b-5 that are used in close proximity to the wafer 108 surface or edge and participate in (i.e., bound) one or more of the meniscuses 106a-6 and 106b-6 so as to assist in forming the meniscuses can be more efficient in moving the liquid contents of the meniscuses if an increased surface tension gradient is present. By way of example, the surface tension gradient can be increased when the proximity head has a lower surface tension than the wafer. The surface tension gradient can be greater because the wafer 108 is more hydrophobic than the proximity heads 106a-5 and 106b-5. A hydrophobic material has less attraction (e.g., higher surface tension) for a selected liquid. A hydrophilic material has a greater attraction (e.g., lower surface tension) for the selected liquid. By way of example, if the proximity heads 106a-5 and 106b-5 have a lower surface tension (e.g., more hydrophilic) for the liquid contents of the meniscus 106a-6, than the wafer 108, then less of the liquid contents of the meniscus will tend to be left behind on the wafer (i.e., the wafer will be dryer) when the meniscus is moved across the wafer. Maximizing the difference in surface tension (i.e., maximizing the surface tension gradient) will further enhance the drying effect of moving the meniscus from a first surface to a second surface.

Therefore the surface materials of such devices and surfaces can be selected to optimize the relative surface tensions of the devices and surfaces as compared to the wafer 108. By way of example, a proximity head having a more hydrophilic property than both the wafer 108 and the edge platform 110 will assist in minimizing the amount of liquid that may remain on the wafer as the meniscus is moved across the surface of the wafer.

Figure 6A:
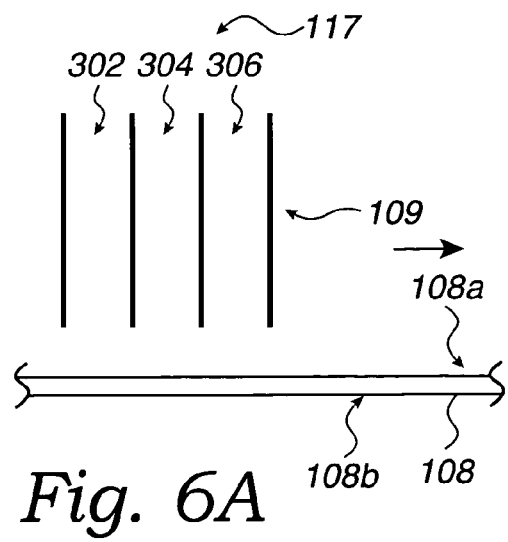
FIG. 6A shows a proximity head inlet/outlet orientation that may be utilized to apply a fabrication process to the wafer in accordance with one embodiment of the present invention.

FIG. 6A shows a proximity head inlet/outlet orientation 117 that may be utilized to apply a fabrication process to the wafer 108 in accordance with one embodiment of the present invention. In one embodiment, the orientation 117 is a portion of a proximity head 106a where other source inlets 302 and 306 in addition to other source outlets 304 may be utilized in addition to the orientation 117 shown. The orientation 117 may include a source inlet 306 on a leading edge 109 with a source outlet 304 in between the source inlet 306 and the source outlet 302.

Figure 6B:
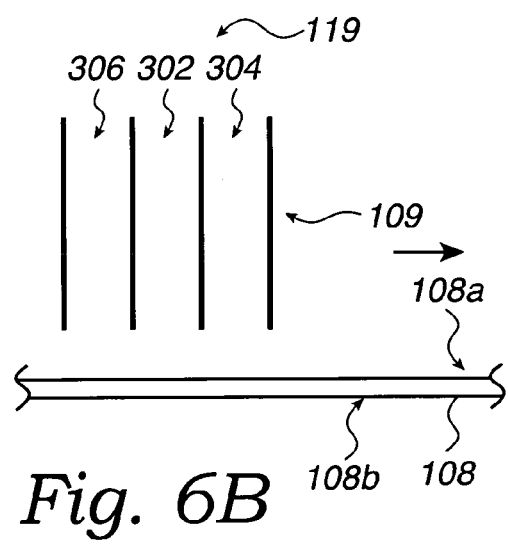
FIG. 6B shows another proximity head inlet/outlet orientation that may be utilized to apply a fabrication process to the wafer in accordance with one embodiment of the present invention.

FIG. 6B shows another proximity head inlet/outlet orientation 119 that may be utilized to apply a fabrication process to the wafer 108 in accordance with one embodiment of the present invention. In one embodiment, the orientation 119 is a portion of a proximity head 106a where other source inlets 302 and 306 in addition to other source outlets 304 may be utilized in addition to the orientation 119 shown. The orientation 119 may include a source outlet 304 on a leading edge 109 with a source inlet 302 in between the source outlet 304 and the source inlet 306.

Figure 6C:
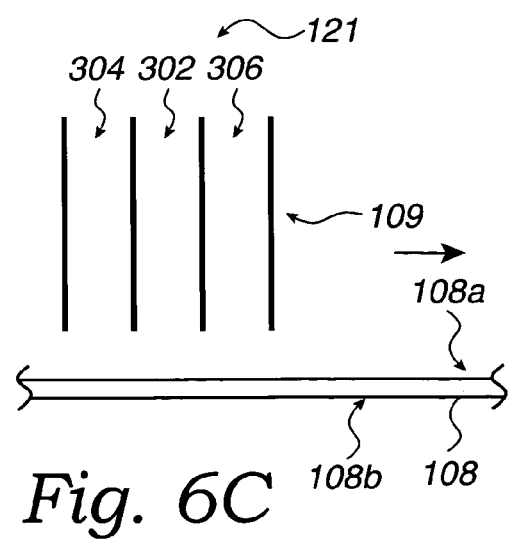
FIG. 6C shows a further proximity head inlet/outlet orientation that may be utilized to apply a fabrication process to the wafer in accordance with one embodiment of the present invention.

FIG. 6C shows a further proximity head inlet/outlet orientation 121 that may be utilized to apply a fabrication process to the wafer 108 in accordance with one embodiment of the present invention. In one embodiment, the orientation 121 is a portion of a proximity head 106a where other source inlets 302 and 306 in addition to other source outlets 304 may be utilized in addition to the orientation 119 shown. The orientation 119 may include a source inlet 306 on a leading edge 109 with a source inlet 302 in between the source outlet 304 and the source outlet 306.

Figure 6D:
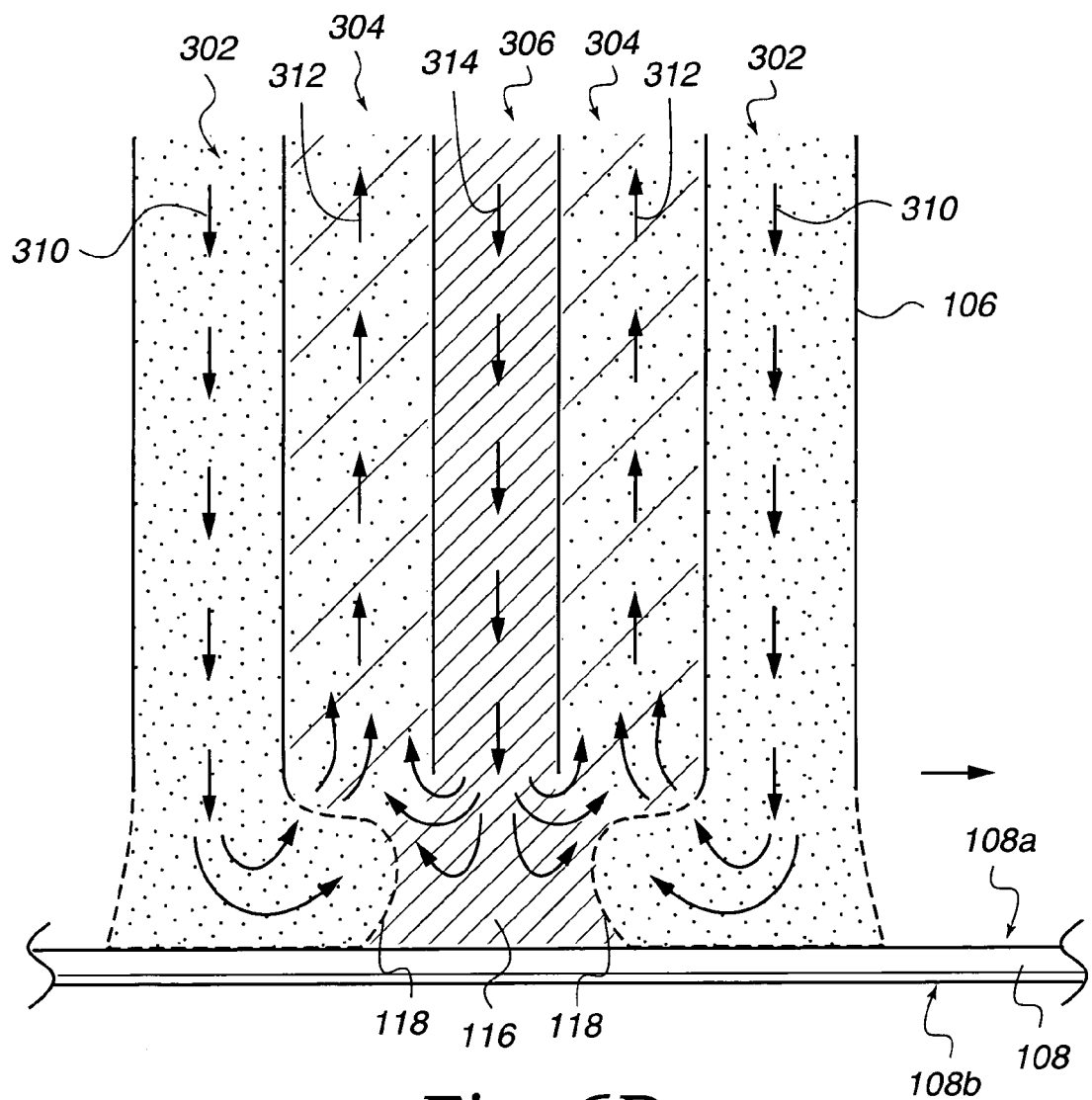
FIG. 6D illustrates a preferable embodiment of an exemplary wafer drying process that may be conducted by a proximity head in accordance with one embodiment of the present invention.

FIG. 6D illustrates a preferable embodiment of an exemplary wafer drying process that may be conducted by a proximity head 106a in accordance with one embodiment of the present invention. Although FIG. 6D shows a top surface 108a being dried, it should be appreciated that the wafer drying process may be accomplished in substantially the same way for the bottom surface 108b of the wafer 108. While FIG. 6D illustrates a wafer drying process, many other fabrication processes may also be applied to the wafer surface in a similar manner. In one embodiment, a source inlet 302 may be utilized to apply isopropyl alcohol (IPA) vapor toward a top surface 108a of the wafer 108, and a source inlet 306 may be utilized to apply deionized water (DIW) toward the top surface 108a of the wafer 108. In addition, a source outlet 304 may be utilized to apply vacuum to a region in close proximity to the wafer surface to remove fluid or vapor that may located on or near the top surface 108a. It should be appreciated that any suitable combination of source inlets and source outlets may be utilized as long as at least one combination exists where at least one of the source inlet 302 is adjacent to at least one of the source outlet 304 which is in turn adjacent to at least one of the source inlet 306. The IPA may be in any suitable form such as, for example, IPA vapor where IPA in vapor form is inputted through use of a $N_2$ carrier gas. Moreover, although DIW is utilized herein, any other suitable fluid may be utilized that may enable or enhance the wafer processing such as, for example, water purified in other ways, cleaning fluids, and other processing fluids and chemistries. In one embodiment, an IPA inflow 310 is provided through the source inlet 302, a vacuum 312 may be applied through the source outlet 304 and DIW inflow 314 may be provided through the source inlet 306. Therefore, an embodiment of the IPA-vacuum-DIW orientation as described above in reference to FIG. 2A is utilized. Consequently, if a fluid film resides on the wafer 108, a first fluid pressure may be applied to the wafer surface by the IPA inflow 310, a second fluid pressure may be applied to the wafer surface by the DIW inflow 314, and a third fluid pressure may be applied by the vacuum 312 to remove the DIW, IPA and the fluid film on the wafer surface.

Therefore, in one embodiment, as the DIW inflow 314 and the IPA inflow 310 is applied toward a wafer surface, any fluid on the wafer surface is intermixed with the DIW inflow 314. At this time, the DIW inflow 314 that is applied toward the wafer surface encounters the IPA inflow 310. The IPA forms an interface 118 (also known as an IPA/DIW interface 118) with the DIW inflow 314 and along with the vacuum 312 assists in the removal of the DIW inflow 314 along with any other fluid from the surface of the wafer 108. In one embodiment, the IPA/DIW interface 118 reduces the surface of tension of the DIW. In operation, the DIW is applied toward the wafer surface and almost immediately removed along with fluid on the wafer surface by the vacuum applied by the source outlet 304. The DIW that is applied toward the wafer surface and for a moment resides in the region between a proximity head and the wafer surface along with any fluid on the wafer surface forms a meniscus 116 where the borders of the meniscus 116 are the IPA/DIW interfaces 118. Therefore, the meniscus 116 is a constant flow of fluid being applied toward the surface and being removed at substantially the same time with any fluid on the wafer surface. The nearly immediate removal of the DIW from the wafer surface prevents the formation of fluid droplets on the region of the wafer surface being dried thereby reducing the possibility of contamination drying on the wafer 108. The pressure (which is caused by the flow rate of the IPA) of the downward injection of IPA also helps contain the meniscus 116.

The flow rate of the $N_2$ carrier gas for the IPA assists in causing a shift or a push of water flow out of the region between the proximity head and the wafer surface and into the source outlets 304 through which the fluids may be output from the proximity head. Therefore, as the IPA and the DIW is pulled into the source outlets 304, the boundary making up the IPA/DIW interface 118 is not a continuous boundary because gas (e.g., air) is being pulled into the source outlets 304 along with the fluids. In one embodiment, as the vacuum from the source outlet 304 pulls the DIW, IPA, and the fluid on the wafer surface, the flow into the source outlet 304 is discontinuous. This flow discontinuity is analogous to fluid and gas being pulled up through a straw when a vacuum is exerted on combination of fluid and gas. Consequently, as the proximity head 106a moves, the meniscus moves along with the proximity head, and the region previously occupied by the meniscus has been dried due to the movement of the IPA/DIW interface 118. It should also be understood that the any suitable number of source inlets 302, source outlets 304 and source inlets 306 may be utilized depending on the configuration of the apparatus and the meniscus size and shape desired. In another embodiment, the liquid flow rates and the vacuum flow rates are such that the total liquid flow into the vacuum outlet is continuous, so no gas flows into the vacuum outlet.

It should be appreciated any suitable flow rate may be utilized for the IPA, DIW, and vacuum as long as the meniscus 116 can be maintained. In one embodiment, the flow rate of the DIW through a set of the source inlets 306 is between about 25 ml per minute to about 3,000 ml per minute. In a preferable embodiment, the flow rate of the DIW through the set of the source inlets 306 is about 400 ml per minute. It should be understood that the flow rate of fluids may vary depending on the size of the proximity head. In one embodiment a larger head may have a greater rate of fluid flow than smaller proximity heads. This may occur because larger proximity heads, in one embodiment, have more source inlets 302 and 306 and source outlets 304 more flow for larger head.

In one embodiment, the flow rate of the IPA vapor through a set of the source inlets 302 is between about 1 standard cubic feet per hour (SCFH) to about 100 SCFH. In a preferable embodiment, the IPA flow rate is between about 5 and 50 SCFH.

In one embodiment, the flow rate for the vacuum through a set of the source outlets 304 is between about 10 standard cubic feet per hour (SCFH) to about 1250 SCFH. In a preferable embodiment, the flow rate for a vacuum though the set of the source outlets 304 is about 350 SCFH. In an exemplary embodiment, a flow meter may be utilized to measure the flow rate of the IPA, DIW, and the vacuum.

Figure 6E:
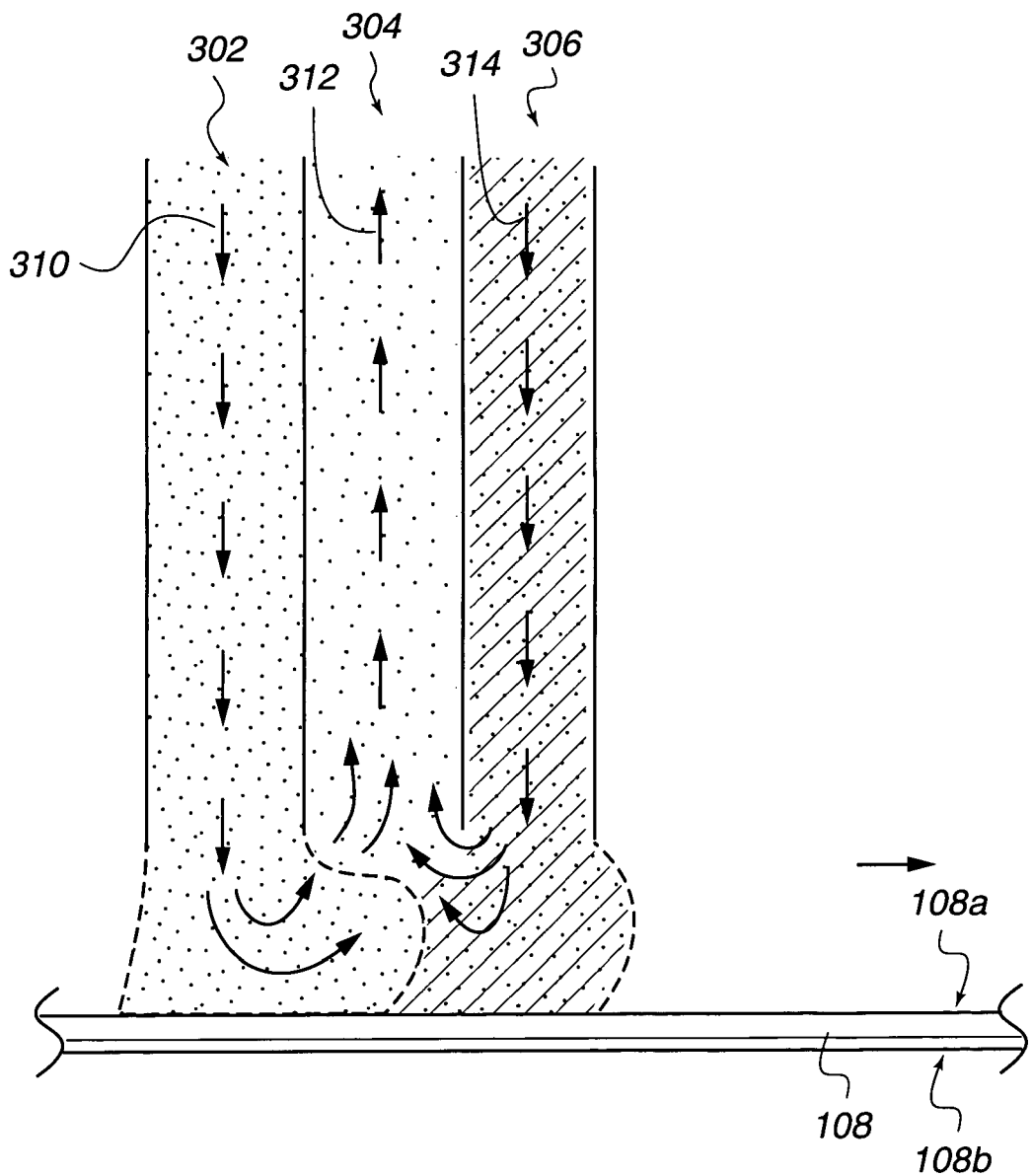
FIG. 6E shows another wafer drying process using another source inlet/outlet orientation that may be conducted by a proximity head in accordance with one embodiment of the present invention.

FIG. 6E shows another wafer drying process using another source inlet/outlet orientation that may be conducted by a proximity head 106a in accordance with one embodiment of the present invention. In this embodiment, the proximity head 106a may be moved over the top surface 108a of the wafer 108 so the meniscus may be moved along the wafer surface 108a. The meniscus applies fluid to the wafer surface and removes fluid from the wafer surface thereby cleaning and drying the wafer simultaneously. In this embodiment, the source inlet 306 applies a DIW flow 314 toward the wafer surface 108a, the source inlet 302 applies IPA flow 310 toward the wafer surface 108a, and the source outlet 312 removes fluid from the wafer surface 108a. It should be appreciated that in this embodiment as well as other embodiments of the proximity head 106a described herein, additional numbers and types of source inlets and source outlets may be used in conjunction with the orientation of the source inlets 302 and 306 and the source outlets 304 shown in FIG. 6E. In addition, in this embodiment as well as other proximity head embodiments, by controlling the amount of flow of fluids onto the wafer surface 108a and by controlling the vacuum applied, the meniscus may be managed and controlled in any suitable manner. For example, in one embodiment, by increasing the DIW flow 314 and/or decreasing the vacuum 312, the outflow through the source outlet 304 may be nearly all DIW and the fluids being removed from the wafer surface 108a. In another embodiment, by decreasing the DIW flow 314 and/or increasing the vacuum 312, the outflow through the source outlet 304 may be substantially a combination of DIW and air as well as fluids being removed from the wafer surface 108a.

Figure 6F:
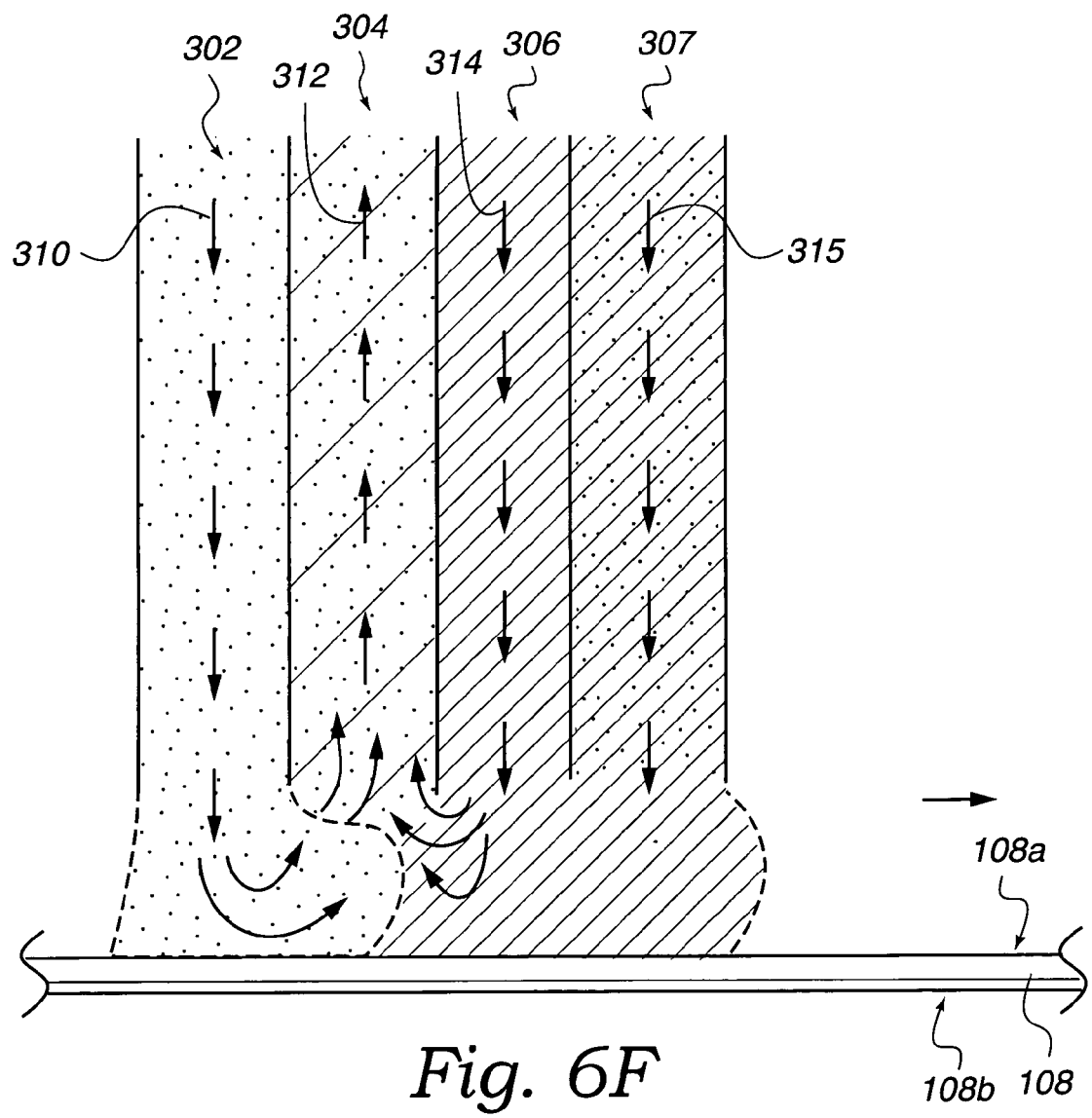
FIG. 6F shows another source inlet and outlet orientation where an additional source outlet may be utilized to input an additional fluid in accordance with one embodiment of the present invention.

FIG. 6F shows another source inlet and outlet orientation where an additional source outlet 307 may be utilized to input an additional fluid in accordance with one embodiment of the present invention. The orientation of inlets and outlets as shown in FIG. 6E is the orientation described in further detail in reference to FIG. 6D except the additional source outlet 307 is included adjacent to the source inlet 306 on a side opposite that of the source outlet 304. In such an embodiment, DIW may be input through the source inlet 306 while a different solution such as, for example, a cleaning solution may be inputted through the source inlet 307. Therefore, a cleaning solution flow 315 may be utilized to enhance cleaning of the wafer 108 while at substantially the same time drying the top surface 108a of the wafer 108.

FIG. 7A illustrates a proximity head 106 performing an exemplary drying operation in accordance with one embodiment of the present invention. The proximity head 106, in one embodiment, moves while in close proximity to the top surface 108a of the wafer 108 to conduct a cleaning and/or drying operation. It should be appreciated that the proximity head 106 may also be utilized to process (e.g., clean, dry, etc.) the bottom surface 108b of the wafer 108. In one embodiment, the wafer 108 is rotating so the proximity head 106 may be moved in a linear fashion along the head motion while fluid is removed from the top surface 108a. By applying the IPA 310 through the source inlet 302, the vacuum 312 through source outlet 304, and the deionized water 314 through the source inlet 306, the meniscus 116 as discussed in reference to FIG. 6D may be generated.

FIG. 7B shows a view of portions of a surface of a proximity head 106 in accordance with one embodiment of the present invention. In the view of one embodiment, from left to right are a set of the source inlet 302, a set of the source outlet 304, a set of the source inlet 306, a set of the source outlet 304, and a set of the source inlet 302 in respective portions or regions of the surface of the proximity head 106. Therefore, as $N_2$/IPA and DIW are inputted into the region between the surface of the proximity head 106 and the wafer 108, the vacuum removes the $N_2$/IPA and the DIW along with any fluid film that may reside on the wafer 108. The source inlets 302, the source inlets 306, and the source outlets 304 described herein may also be any suitable type of geometry such as for example, circular opening, square opening, etc. In one embodiment, the source inlets 302 and 306 and the source outlets 304 have circular openings.

Figure 8A:
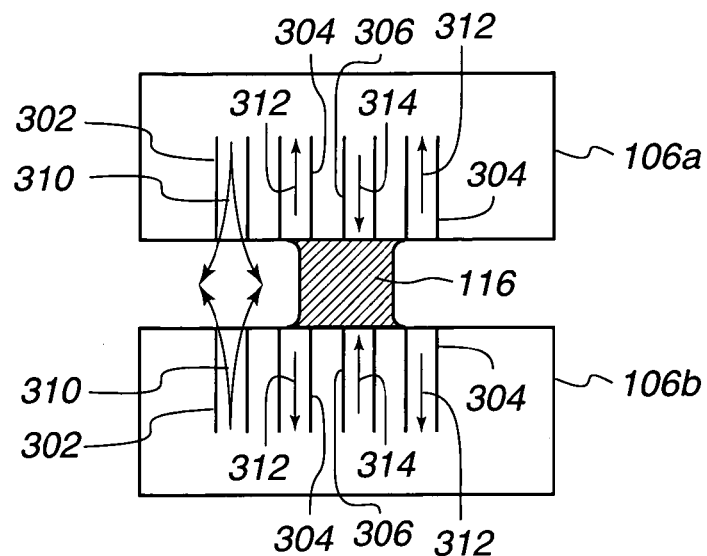
FIG. 8A illustrates a side view of the proximity heads for use in a dual wafer surface processing system in accordance with one embodiment of the present invention.

FIG. 8A illustrates a side view of the proximity heads 106 and 106b for use in a dual wafer surface processing system in accordance with one embodiment of the present invention. In this embodiment, by usage of source inlets 302 and 306 to input $N_2$/IPA and DIW (or other processing fluids) respectively along with the source outlet 304 to provide a vacuum, the meniscus 116 may be generated. In addition, on the side of the source inlet 306 opposite that of the source inlet 302, there may be a source outlet 304 to remove DIW and to keep the meniscus 116 intact. As discussed above, in one embodiment, the source inlets 302 and 306 may be utilized for $N_2$/IPA inflow 310 and DIW inflow 314 respectively while the source outlet 304 may be utilized to apply vacuum 312. It should be appreciated that any suitable configuration of source inlets 302, source outlets 304 and source inlets 306 may be utilized. For example, the proximity heads 106 and 106b may have a configuration of source inlets and source outlets like the configuration described above in reference to FIGS. 7A and 7B. In addition, in yet more embodiments, the proximity heads 106 and 106b may be of a configuration as shown below in reference to FIGS. 9A through 10B. Any suitable surface coming into contact with the meniscus 116 may be dried by the movement of the meniscus 116 into and away from the surface.

Figure 8B:
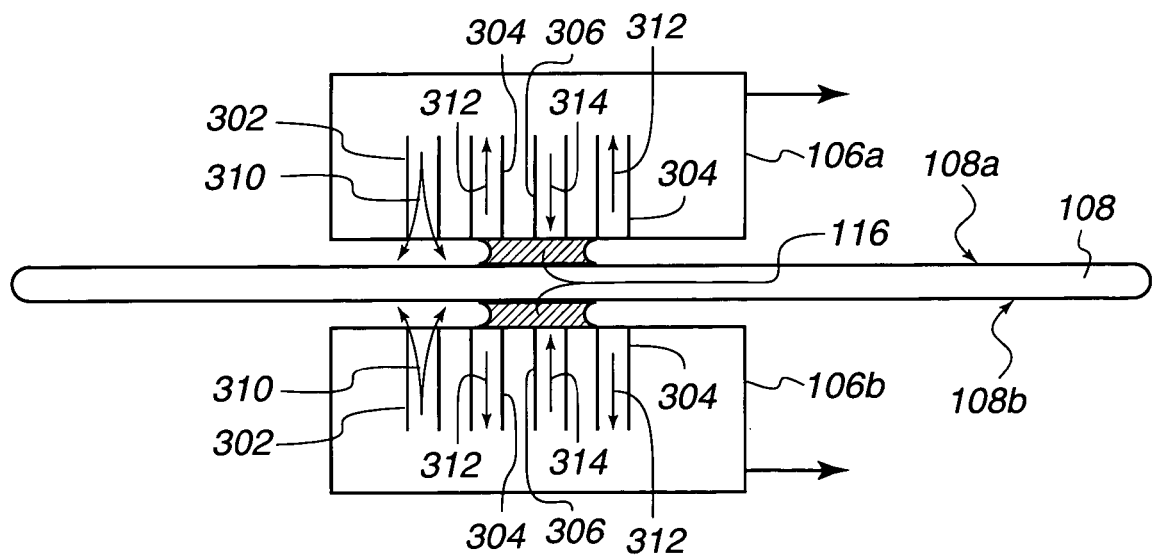
FIG. 8B shows the proximity heads in a dual wafer surface processing system in accordance with one embodiment of the present invention.

FIG. 8B shows the proximity heads 106 and 106b in a dual wafer surface processing system in accordance with one embodiment of the present invention. In this embodiment, the proximity head 106 processes the top surface 108a of the wafer 108, and the proximity head 106b processes the bottom surface of 108b of the wafer 108. By the inputting of the $N_2$/IPA and the DIW by the source inlets 302 and 306 respectively, and by use of the vacuum from the source outlet 304, the meniscus 116 may be formed between the proximity head 106 and the wafer 108 and between the proximity head 106b and the wafer 108. The proximity heads 106 and 106b, and therefore the meniscus 116, may be moved over the wet areas of the wafer surface in a manner so the entire wafer 108 can be processed (e.g., cleaned, dried).

Figure 9A:
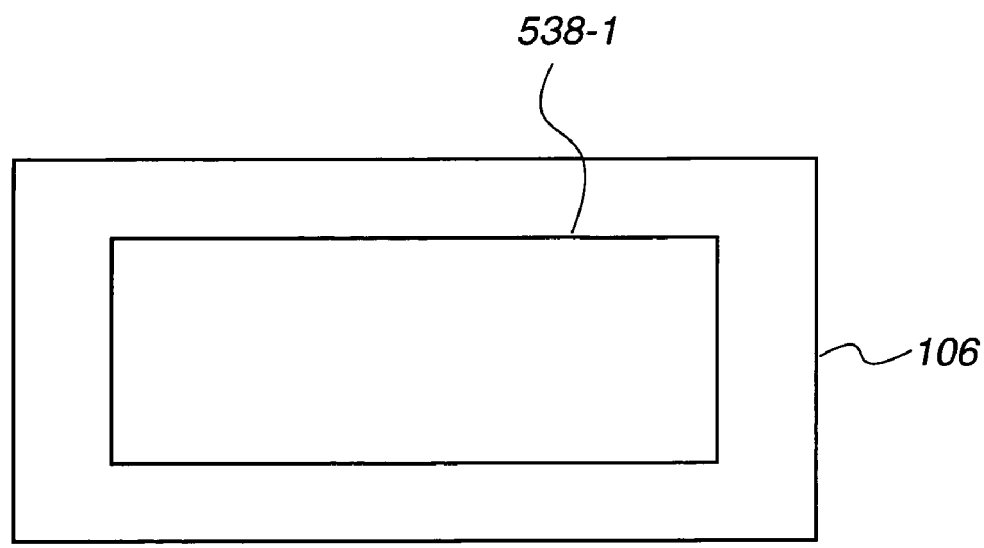
FIG. 9A illustrates a processing window in accordance with one embodiment of the present invention.

FIG. 9A illustrates a processing window 538-1 in accordance with one embodiment of the present invention. In one embodiment, the processing window 538-1 may include multiple source inlets 302 and 306 and also multiple source outlets 304. The processing window 538-1 is a region on a proximity head 106 (or any other proximity head referenced herein) that may generate and control the shape and size (e.g., area) of the meniscus 116. Therefore, the processing window 538-1 may be a region that dries a wafer if the proximity head 106 is desired to be used in that manner. In one embodiment, the processing window 538-1 is a substantially rectangular shape. It should be appreciated that the size of the processing window 538-1 (or any other suitable processing window described herein) may be any suitable length and width (as seen from a top view).

Figure 9B:
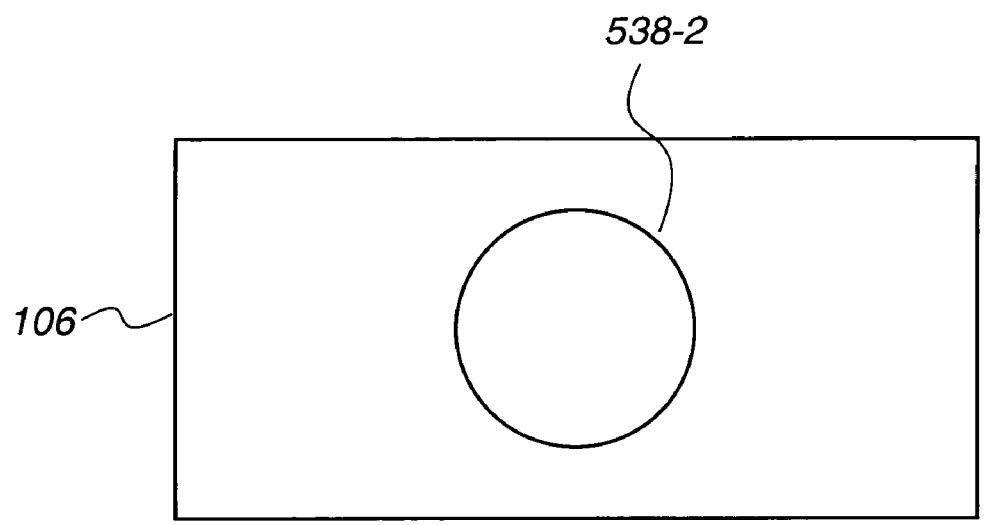
FIG. 9B illustrates a substantially circular processing window in accordance with one embodiment of the present invention.

FIG. 9B illustrates a substantially circular processing window 538-2 in accordance with one embodiment of the present invention. In one embodiment, the processing window 538-2 may include multiple source inlets 302 and 306 and also multiple source outlets 304. The processing window 538-2 is a region on the proximity head 106 (or any other proximity head referenced herein) that may generate and control the meniscus 116. Therefore, the processing window 538-2 may be a region that dries a wafer if the proximity head 106 is desired to be used in that manner. In one embodiment, the processing window 538-2 is a substantially circular shape.

Figure 10A:
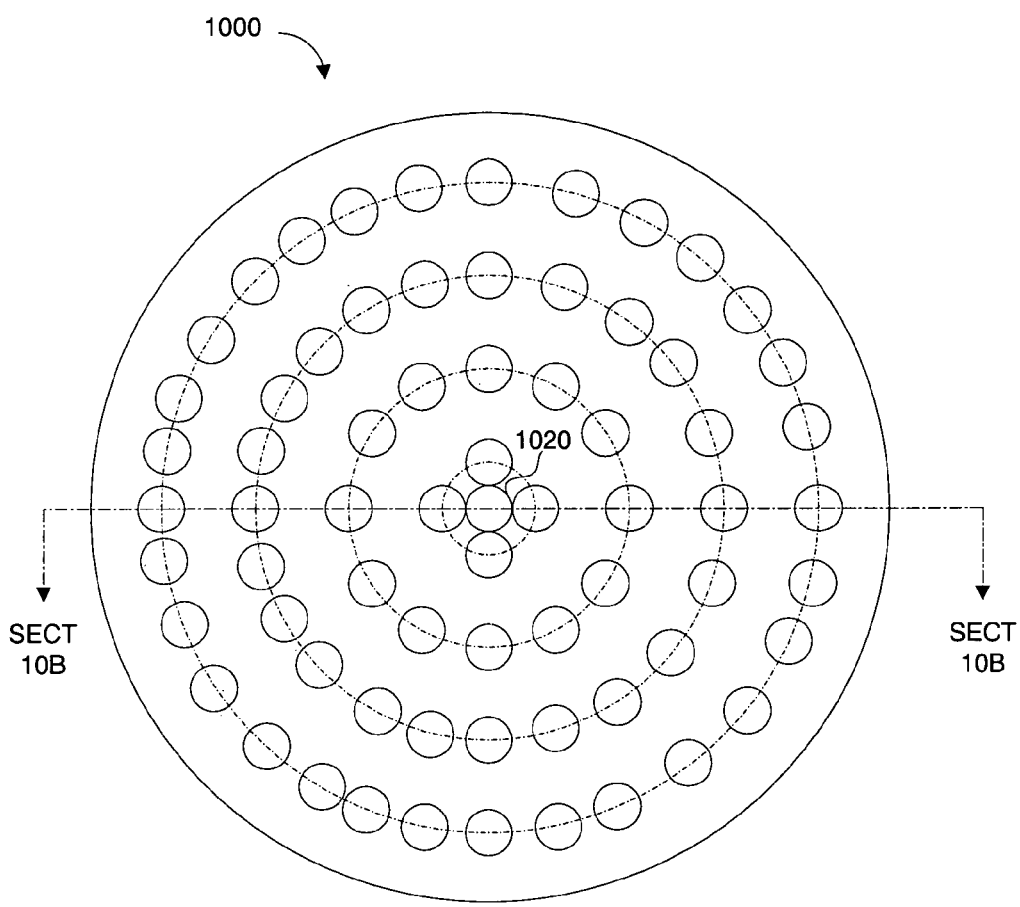
FIG. 10A illustrates an exemplary proximity head, in accordance with one embodiment of the present invention.
Figure 10B:
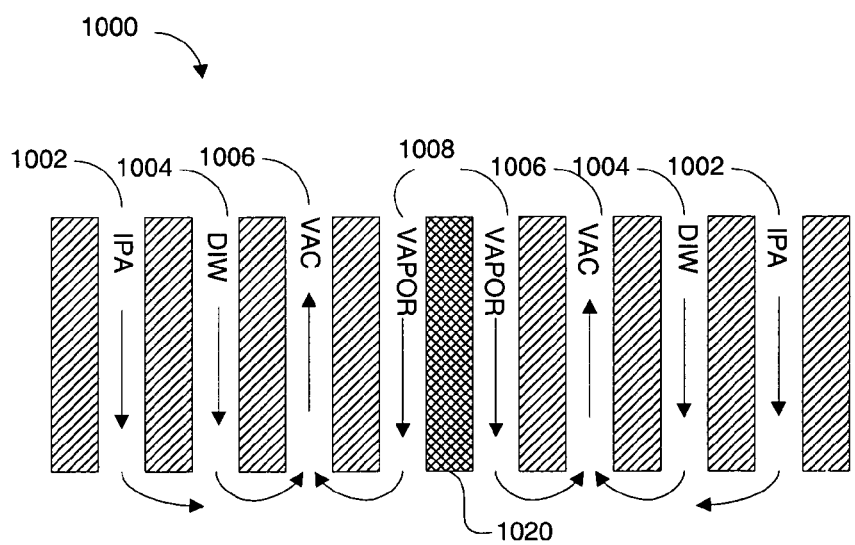
FIG. 10B illustrates a sectional view of the proximity head, in accordance with one embodiment of the present invention.

FIG. 10A illustrates an exemplary proximity head 1000, in accordance with one embodiment of the present invention. FIG. 10B illustrates a sectional view of the proximity head 1000, in accordance with one embodiment of the present invention. The proximity head 1000 includes multiple process chemistry inlets 1004, multiple IPA inlets 1002, multiple IPA vapor inlets 1008 and multiple vacuum outlets 1006. The various inlets 1002, 1004, 1006 and outlets 1008 are arranged around a sensor 1020. The sensor 1020 is a metrology sensor that can evaluate the progress of the fabrication process being applied by the processing head 1000.

The sensor 1020 can be any type of sensor that may be useful within the proximity head 1000. By way of example, an in-situ metrology sensor can monitor an etch process to determine if the material desired to be etched away has been fully removed or partially removed according to the desired result. The sensor 1020 can include one or more of the following exemplary types of sensors: eddy current sensor (e.g., for measuring metal and other compatible materials), scatterometry (e.g., for particle or topography measurements), optical interferometry or reflectometery (e.g., for measuring film thickness) and any other of the various endpoint detection methods that are known to one skilled in the art.

Figure 11A:
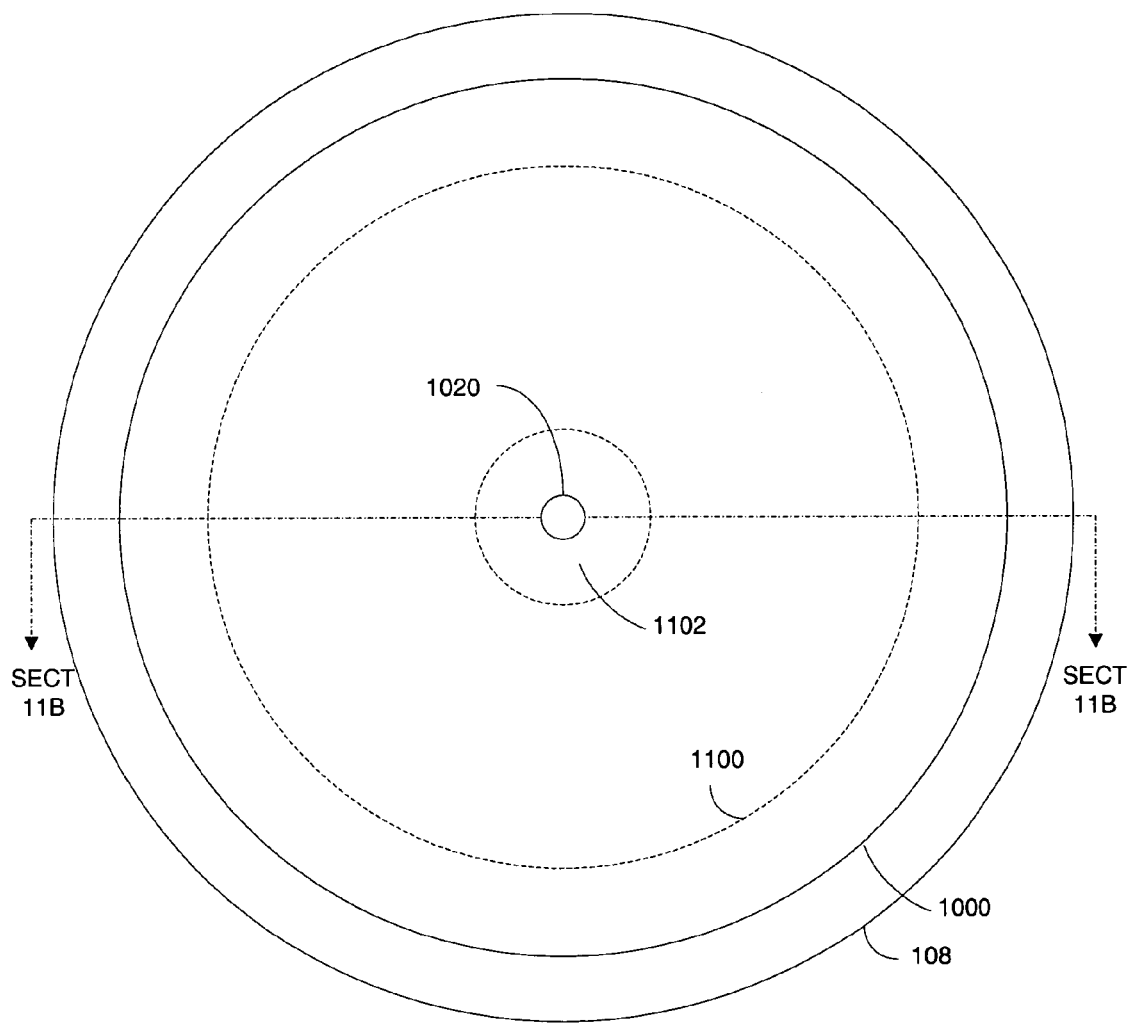
FIG. 11A shows a top view of an exemplary meniscus formed by the proximity head, in accordance with one embodiment of the present invention.
Figure 11B:
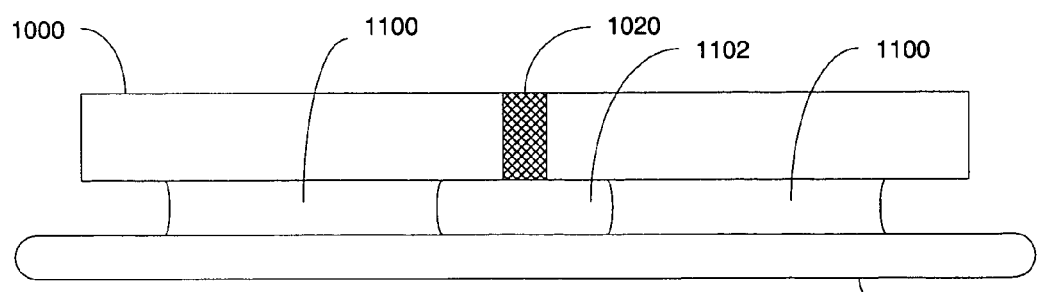
FIG. 11B shows a sectional view of the meniscus formed by the proximity head, in accordance with one embodiment of the present invention.

FIG. 11A shows a top view of an exemplary meniscus 1100 formed by the proximity head 1000, in accordance with one embodiment of the present invention. FIG. 11B shows a sectional view of the meniscus 1100 formed by the proximity head 1000, in accordance with one embodiment of the present invention. The meniscus 1100 includes a "dry" central region 1102 where the liquid meniscus is removed so that the sensor 1020 has no intervening processing chemistry from the meniscus 1100 between the sensor and the surface of the wafer 108.

By way of example, the sensor 1020 can be a fiber optic sensor that can be used for laser or broadband optical interferometry from the dry central region 1102. In one embodiment, the proximity head 1000 can apply an etch process to the wafer 108. To be effective and timely, an etch process requires a higher concentration of etch chemistry than would typically be used in a multiple wafer batch process to be applied to the film to be removed from the surface of the wafer 108. A precise in-situ film measurement can be accomplished by the optical interferometry in the dry central region 1102 without the interference typically caused by a thin liquid film. Rotating the wafer and scanning the proximity head 1000, and therefore the sensor 1020, across the wafer 108 can provide an in-situ scan of the entire surface of the wafer, as the proximity head processes the wafer.

The sensor 1020 can also provide real time feedback of the etch process. Providing the real time feedback to a control system that controls the etch process will provide a closed control loop of the etch process. The closed loop control of the etch process can allow the control system to interactively adjust the etch process in real time. Any of the multiple etch process variables can be adjusted including head position, concentrations, resident time, flow rates, pressures, chemistry and other process variables. In this manner more precise process control is provided. A more precise process control allows ever more concentrated etch chemistries to be used, which in turn reduces the process time of the wafer to a minimum.

The in-situ, real time control of the process can also enable a variable process to be applied to the surface of the wafer such as to correct for a non-uniformity during the processing of the wafer. By way of example, if in an etch process, the sensor can detect a thinner film in a first region of the wafer 108 and a thicker film in a second region. The etch process recipe can be dynamically adjusted (e.g., etch chemistry concentration, residence time, etc.) for the detected film thickness as the proximity head 1000 scans across the wafer 108. As a result, the non-uniform film thickness can be dynamically corrected in-situ as the etch process is applied to the wafer 108 thereby substantially eliminating the need for reprocessing the wafer to correct for non-uniformities.

In an alternative embodiment, the dry region 1102 is not required. By way of example, if the sensor 1020 is an eddy current sensor, then the eddy current sensor can measure film thickness through a layer of liquid (e.g., the meniscus 1100) such as the process chemistry being applied to the surface of the wafer 108.

Figure 12A:
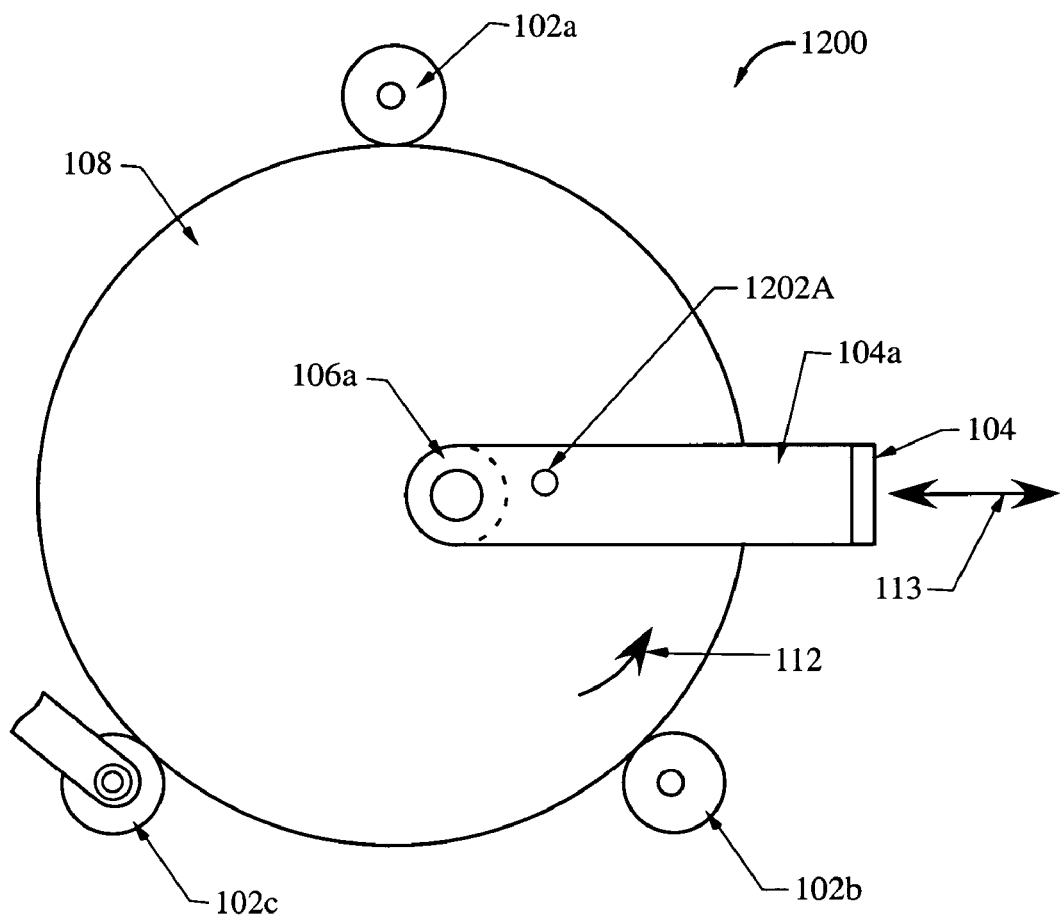
FIG. 12A shows a wafer processing system in accordance with one embodiment of the present invention.

FIG. 12A shows a wafer processing system 1200 in accordance with one embodiment of the present invention. The wafer processing system 1200 is similar to the wafer processing system 100 described above in FIG. 3A, however with the addition of an in-situ sensor 1202A. The sensor 1202A is mounted on the arm 104a, external of the proximity head 106a, but can move in tandem with the proximity head. As a result, the sensor 1202A can measure corresponding locations near the process being applied to the wafer 108 by the proximity head 106a.

Figure 12B:
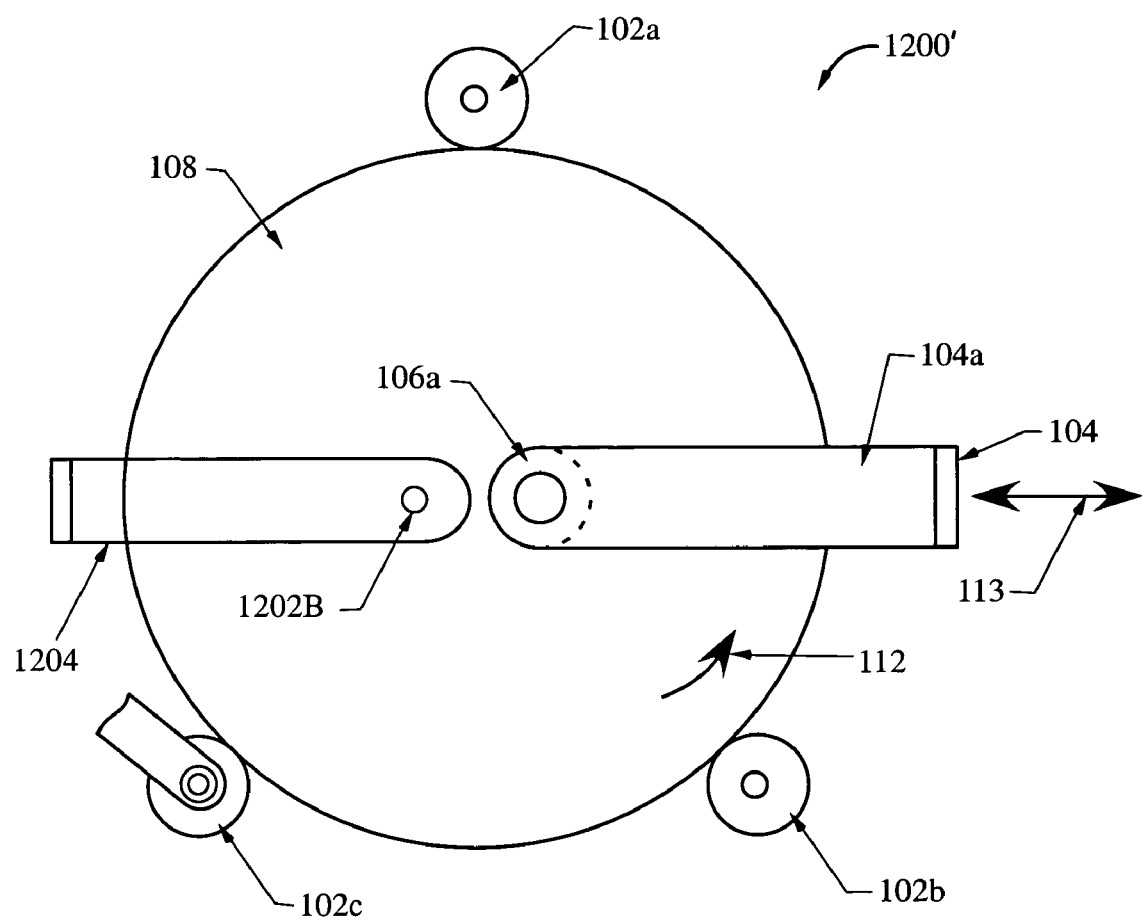
FIG. 12B shows a wafer processing system in accordance with one embodiment of the present invention.

FIG. 12B shows a wafer processing system 1200' in accordance with one embodiment of the present invention. The wafer processing system 1200' is similar to the wafer processing system 1200 described above in FIG. 12A, however with an in-situ sensor 1202B mounted in an arm 1204 that is separate from the arm 104a holding the proximity head 106a. The arm 1204 allows the sensor 1202B to move independently from the proximity head 106a. As a result, the sensor 1202B can measure corresponding locations near the process being applied to the wafer 108 by the proximity head 106a and can independently scan locations on the surface of the wafer substantially simultaneously as the proximity head applies a process to the wafer.

Figure 13:
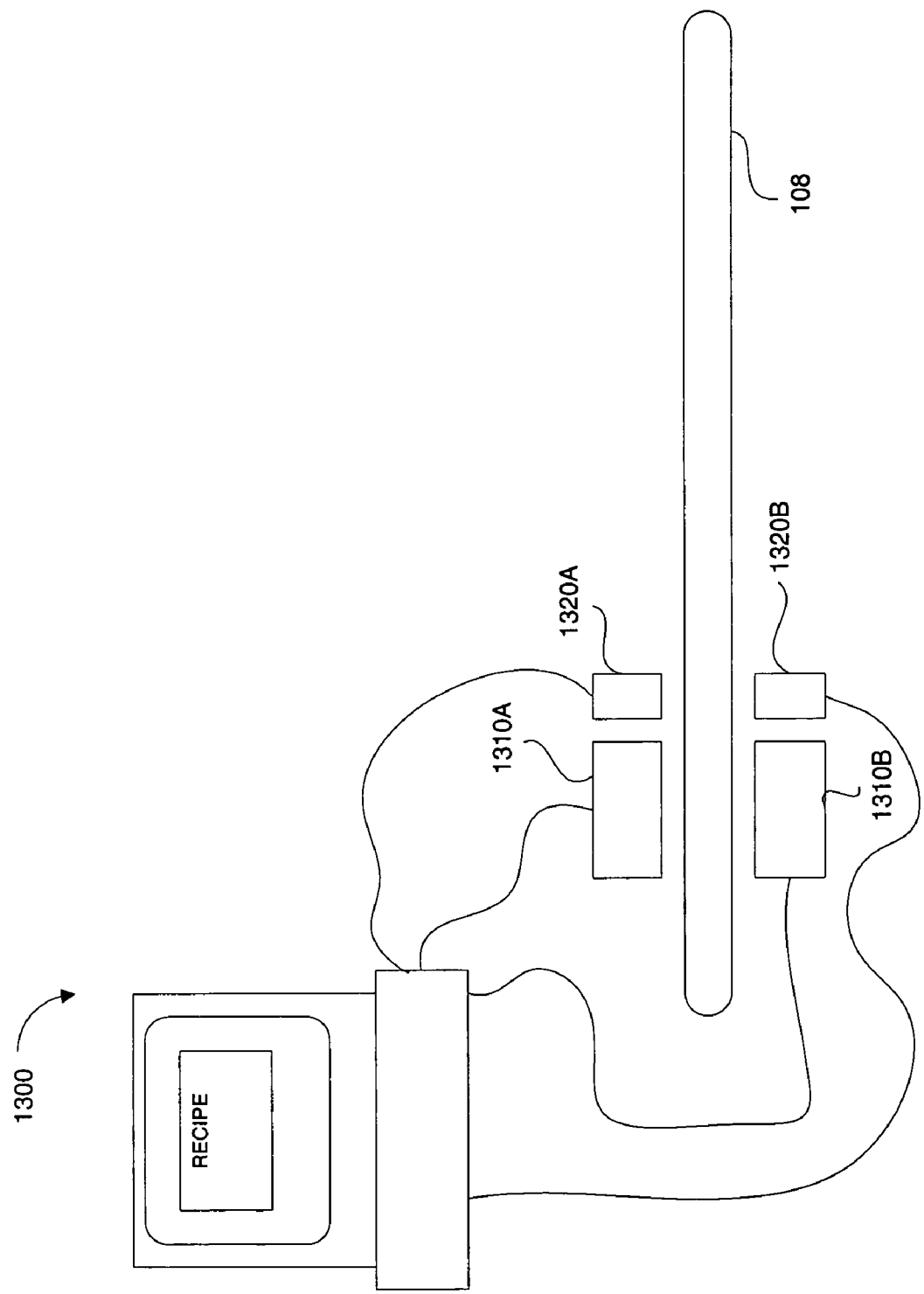
FIG. 13 shows a block diagram of a wafer processing system in accordance with one embodiment of the present invention.

FIG. 13 shows a block diagram of a wafer processing system 1300 in accordance with one embodiment of the present invention. The system includes a controller 1302 that includes a recipe 1304. The recipe 1304 controls the various parameters and aspects of the processes applied to the wafer 108 by the proximity heads 1310A, 1301B. By way of example, the recipe determines flowrates of DIW, IPA and IPA vapor and pressures of the vacuum and the precise location of the proximity heads 1310A, 1310B and the direction and rate of rotation of the wafer 108, if the wafer is rotated. Sensors 1320A, 1320B monitor and evaluate the processes applied to the wafer 108 by the proximity heads 1310A, 1301B. In one embodiment, the sensors 1320A, 1320B can provide feedback to the controller 1302. The controller 1302 can then modify the recipe in response to the feedback from one or more of the sensors. The sensors 1320A, 1320B can be included within the proximity heads 1310A, 1301B such as described in FIGS. 10A-11B above. Alternatively, the sensors 1320A, 1320B can be external to the proximity heads 1310A, 1301B as described in FIGS. 12A and 12B above.

Figure 14:
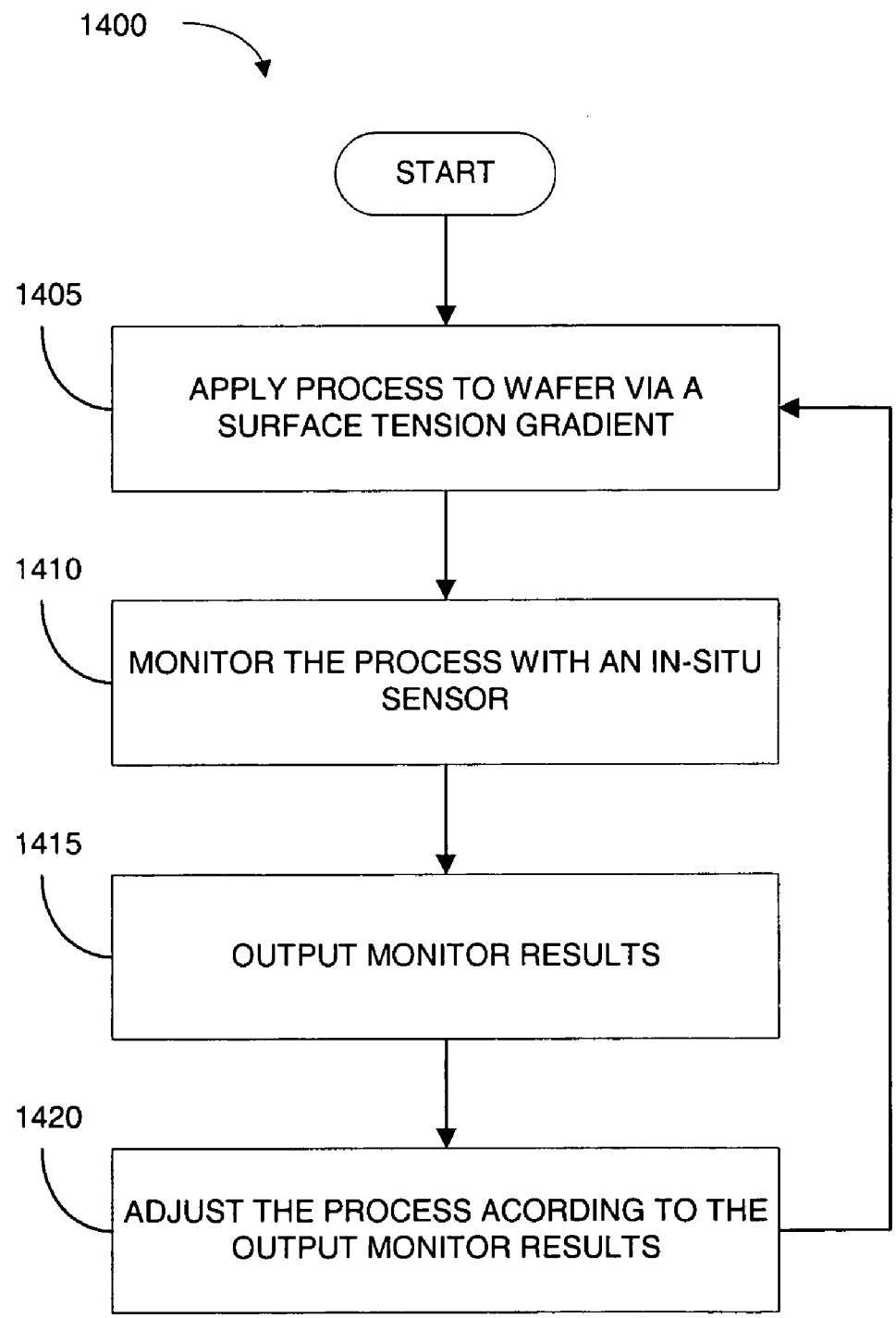
FIG. 14 is a flowchart of the method operations for in-situ monitoring a process in a proximity head, in accordance with one embodiment of the present invention.

FIG. 14 is a flowchart of the method operations 1400 for in-situ monitoring a process in a proximity head, in accordance with one embodiment of the present invention. In an operation 1405, a process to the surface of the wafer 108 by a surface tension gradient process system such as a proximity head. The process can include a rinsing, cleaning, etching, drying, deposition, electroplating or other process capable of being applied by the surface tension gradient. A proximity head can support an electroplating process as described in commonly assigned U.S. patent application Ser. No. 10/607,611 which was filed on MMMM DD, 20YY, and entitled "Apparatus and Method for Depositing and Planarizing Thin Films of Semiconductor Wafers," which is incorporated by reference in its entirety herein for all purposes.

In an operation 1410, an in-situ sensor monitors the process being applied to the wafer 108 as described in detail above.

In an operation 1415, the in-situ sensor outputs the monitoring results of the process in real time. In one embodiment, the monitoring results are stored for later reference. In an alternative embodiment, the monitoring results are output to a control system that controls the process.

In an operation 1420, the process (e.g., the recipe) is adjusted according to the monitoring results output from the in-situ sensor. In one embodiment, the process is adjusted dynamically, in real time by the control system. In an alternative embodiment, the process is adjusted for a subsequent wafer. The method and operations can then end. Alternatively, if the process is adjusted in real time, then the method and operations can repeat beginning with operation 1405 above.

As described herein, the in-situ sensor can provide additional process control. The process control can therefore be a more precisely controlled process that in turn allows a faster process time which translates to an increased wafer throughput. In addition, the in-situ sensor can provide real time process data that can be used to adjust the process dynamically and in real time.

It will be further appreciated that the instructions represented by the operations in FIG. 14 are not required to be performed in the order illustrated, and that all the processing represented by the operations may not be necessary to practice the invention. Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A wafer processing system comprising:
    at least one surface tension gradient device capable of supporting a process in a liquid meniscus, the surface tension gradient device including a proximity head including:
        a head surface, the head surface having a plurality of flat surface regions;
        a plurality of source inlets in at least one of the plurality of flat surface regions of the head surface; and
        a plurality of source outlets in at least one of the a plurality of flat surface regions of the head surface, wherein the plurality of source inlets and the plurality of source outlets are defined by discrete holes that reside at the head surface and extend through the flat surface regions of the head surface;
    an in-situ sensor for monitoring a result of the process; and
    a system controller being coupled to the in-situ sensor and the surface tension gradient device, the system controller including a process recipe.

2. The system of claim 1, wherein the process can include at least one of a group of processes consisting of a cleaning process, a rinsing process, an etch process, a deposition process, and an electroplating process.

3. The system of claim 1, wherein the in-situ sensor can include at least one of a group consisting of an optical sensor and an eddy current sensor.

4. The system of claim 1, wherein the monitored result is output in real time.

5. The system of claim 1, wherein the in-situ sensor is included within the surface tension gradient device.

6. The system of claim 5, wherein the meniscus includes a dry region surrounding the in-situ sensor.

7. The system of claim 1, wherein the in-situ sensor can be moved with the surface tension gradient device.

8. The system of claim 1, wherein the in-situ sensor can be moved independent from the surface tension gradient device.

9. The system of claim 1, wherein the liquid meniscus is supported between the head surface and a surface of the wafer being processed, wherein the liquid meniscus is in contact with the surface of the proximity head and the surface of the wafer being processed.

10. The system of claim 9, wherein the surface of the proximity head has a first hydrophilic property for a selected liquid and the surface of the wafer being processed has a second hydrophilic property for the selected liquid, wherein the first hydrophilic property is more hydrophilic than the second hydrophilic property.

11. The system of claim 1, wherein the controller includes a capability for modifying the recipe for the process in the process controller according to the monitored results.

12. The system of claim 11, wherein the capability for modifying the recipe for the process in the process controller according to the monitored results includes a capability for modifying the process in real time.

13. A wafer processing system comprising:
    a proximity head capable of supporting a process in a liquid meniscus, the liquid meniscus being supported between a head surface of the proximity head and a surface of the wafer being processed, the proximity head including:

an in-situ sensor for monitoring a result of the process, wherein the head surface has a plurality of flat surface regions;

a plurality of source inlets in at least one of the at least one of the plurality of flat surface regions of the head surface; and a plurality of source outlets in at least one of the plurality of flat surface regions of the head surface, wherein the plurality of source inlets and the plurality of source outlets are defined by discrete holes that reside at the head surface and extend through the flat surface regions of the head surface; and a system controller being coupled to the in-situ sensor and the proximity head, the system controller including a process recipe.

14. The system of claim 13, wherein the controller includes a capability for modifying the recipe for the process in the process controller according to the monitored results.

15. A wafer processing system comprising:

a proximity head capable of supporting a process in a liquid meniscus, the liquid meniscus being supported between a head surface of the proximity head and a surface of the wafer being processed, wherein the head surface of the proximity head has a first hydrophilic property for a selected liquid and the surface of the wafer being processed has a second hydrophilic property for the selected liquid, wherein the first hydrophilic property is more hydrophilic than the second hydrophilic property, the proximity head including:

a first surface, the first surface having a plurality of flat surface regions;

a plurality of source inlets in at least one of the plurality of flat surface regions of the head surface; and a plurality of source outlets in at least one of the plurality of flat surface regions of the head surface, wherein the plurality of source inlets and the plurality of source outlets are defined by discrete holes that reside at the head surface and extend through the flat surface regions of the head surface;

an in-situ sensor for monitoring a result of the process; and a system controller being coupled to the in-situ sensor and the proximity head, the system controller including a process recipe, system controller including a capability for modifying the recipe for the process in the process controller according to the monitored results in real time.

* * * * *